US011158572B2

(12) United States Patent
Lu

(10) Patent No.: US 11,158,572 B2
(45) Date of Patent: Oct. 26, 2021

(54) PACKAGE STRUCTURE INCLUDING A FIRST ELECTRONIC DEVICE, A SECOND ELECTRONIC DEVICE AND A PLURALITY OF DUMMY PILLARS

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/557,740

(22) Filed: Aug. 30, 2019

(65) Prior Publication Data

US 2021/0066188 A1    Mar. 4, 2021

(51) Int. Cl.
| H01L 23/522 | (2006.01) |
| H01L 23/00 | (2006.01) |
| H01L 21/768 | (2006.01) |
| H01L 23/31 | (2006.01) |
| H01L 21/56 | (2006.01) |

(52) U.S. Cl.
CPC ........ *H01L 23/5226* (2013.01); *H01L 21/565* (2013.01); *H01L 21/76816* (2013.01); *H01L 21/76871* (2013.01); *H01L 23/3178* (2013.01); *H01L 24/09* (2013.01); *H01L 2924/3511* (2013.01)

(58) Field of Classification Search
CPC ........... H01L 23/5226; H01L 24/09; H01L 21/76871; H01L 23/3178; H01L 21/565; H01L 21/76816; H01L 2924/3511; H01L 23/522; H01L 23/00; H01L 23/31; H01L 21/768; H01L 21/56

USPC .......................................................... 257/774
See application file for complete search history.

(56) References Cited

U.S. PATENT DOCUMENTS

| 7,960,821 | B2 | 6/2011 | Chen et al. | |
| 9,406,600 | B2 | 8/2016 | Kudo | |
| 9,793,246 | B1 | 10/2017 | Tseng et al. | |
| 9,905,527 | B1 | 2/2018 | Hacker | |
| 2011/0095418 | A1 | 4/2011 | Lim et al. | |
| 2011/0198747 | A1 | 8/2011 | Kuo et al. | |
| 2012/0286418 | A1 | 11/2012 | Lee et al. | |
| 2015/0035161 | A1 | 2/2015 | Miao et al. | |
| 2015/0371947 | A1 | 12/2015 | Chen et al. | |
| 2016/0005707 | A1* | 1/2016 | Kwon | H01L 25/0657 257/737 |
| 2016/0035639 | A1 | 2/2016 | Wu et al. | |
| 2016/0086866 | A1 | 3/2016 | Choi | |
| 2018/0145033 | A1* | 5/2018 | Yi | H01L 23/49838 |
| 2019/0067230 | A1 | 2/2019 | Liu et al. | |
| 2019/0371694 | A1 | 12/2019 | Hsu et al. | |
| 2020/0013735 | A1* | 1/2020 | Liu | H01Q 9/0407 |

(Continued)

OTHER PUBLICATIONS

Non-Final Office Action for U.S. Appl. No. 16/557,763, dated Apr. 15, 2021, 12 pages.

*Primary Examiner* — Alexander O Williams
(74) *Attorney, Agent, or Firm* — Foley & Lardner LLP

(57) ABSTRACT

A package structure includes a base material, at least one electronic device, at least one dummy pillar and an encapsulant. The electronic device is electrically connected to the base material. The dummy pillar is disposed on the base material. The encapsulant covers the electronic device and a top end of the dummy pillar.

19 Claims, 37 Drawing Sheets

(56) References Cited

U.S. PATENT DOCUMENTS

| | | | |
|---|---|---|---|
| 2020/0051868 A1* | 2/2020 | Zang | H01L 29/66545 |
| 2020/0052207 A1* | 2/2020 | Ando | H01L 45/08 |
| 2020/0249490 A1 | 8/2020 | Lee et al. | |
| 2020/0411499 A1* | 12/2020 | Hsu | H01L 24/73 |
| 2021/0007220 A1 | 1/2021 | Kobayashi et al. | |
| 2021/0057354 A1 | 2/2021 | Eid | |

* cited by examiner

PACKAGE STRUCTURE INCLUDING A FIRST ELECTRONIC DEVICE, A SECOND ELECTRONIC DEVICE AND A PLURALITY OF DUMMY PILLARS

BACKGROUND

1. Field of the Disclosure

The present disclosure relates to a package structure and a manufacturing method, and to a package structure including at least one dummy pillar and a method for manufacturing the package structure.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may correspondingly increase. In addition, if a gap between two adjacent electronic components or electronic devices is relatively large, an encapsulant may be recessed to form a dimple corresponding to such gap. Thus, a yield of the semiconductor package structure may decrease.

SUMMARY

In some embodiments, a package structure includes a base material, at least one electronic device, at least one dummy pillar and an encapsulant. The electronic device is electrically connected to the base material. The dummy pillar is disposed on the base material. The encapsulant covers the electronic device and a top end of the dummy pillar.

In some embodiments, a method for manufacturing a package structure includes: (a) providing a base material; (b) forming at least one dummy pillar on the base material, and electrically connecting at least one electronic device to the base material; and (c) forming an encapsulant to cover the at least one electronic device and the at least one dummy pillar.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
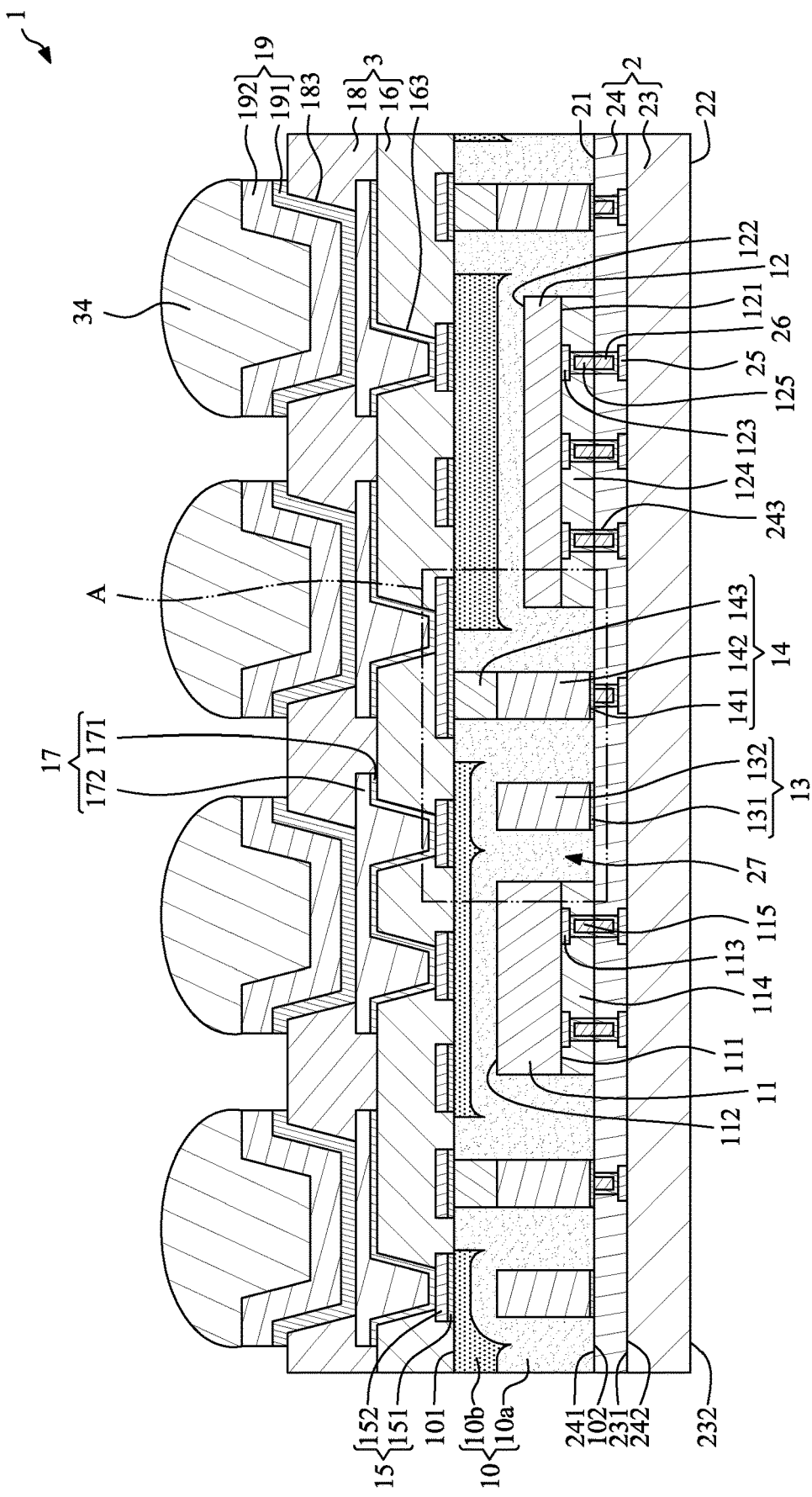
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative embodiment, a semiconductor package structure may include a plurality of electronic components (or electronic devices) electrically connected to a substrate, and an encapsulant (e.g., a molding compound) covers the electronic components (or electronic devices) and the substrate. Such semiconductor package structure may suffer from warpage due to a coefficient of thermal expansion (CTE) mismatch between the electronic components, the substrate and the encapsulant (e.g., a molding compound).

In addition, such semiconductor package structure may further include a plurality of interconnection solder balls for electrically connecting the substrate and an upper wiring structure on the encapsulant and above the electronic components. In order to minimize the size of the semiconductor package structure with an increased number of I/O connections, ultra-fine circuit design (e.g., the pad size is less than 5 micrometers (μm), and bonding space is less than 10 μm) has to be used. However, a minimum pitch of the solder balls may be about 30 micrometers (μm) to 40 μm (e.g., the ball width/ball space may be about 20 μm/20 μm), which cannot meet the specification of increasing I/O counts. To address such concern, a plurality of high density fine pillars may be used to replace the solder balls. However, the formation of such high density fine pillars embedded in the encapsulant is an issue.

At least some embodiments of the present disclosure provide for a package structure which includes at least one dummy pillar formed before the formation of the encapsulant. At least some embodiments of the present disclosure further provide for techniques for manufacturing the package structure.

FIG. 1 illustrates a cross-sectional view of a package structure 1 according to some embodiments of the present disclosure. The package structure 1 includes a base material 2, at least one electronic device (including, for example, a first electronic device 11 and a second electronic device 12), at least one dummy pillar 13, at least one conductive pillar 14, an encapsulant 10, an upper wiring structure 3 and at least one external connector 34.

The base material 2 has a first surface 21 and a second surface 22 opposite to the first surface 21. The base material 2 may be a carrier for carrying the electronic device (including, for example, a first electronic device 11 and a second electronic device 12). In some embodiments, the base material 2 may be a semiconductor die, a semiconductor chip, a wafer, a panel, a strip, a package substrate or a printed circuit board. As shown in FIG. 1, the base material 2 includes a main body 23, a passivation layer 24 and a plurality of inner vias 26. The main body 23 has a first surface 231 and a second surface 232 opposite to the first surface 231, and includes a plurality of pads 25 disposed adjacent to the first surface 231. The second surface 232 of the main body 23 is the second surface 22 of the base material 2. In some embodiments, a material of the main body 23 may include semiconductor material such as silicon. It is noted that the pads 25 may be included in a circuit layer disposed on the first surface 231. The passivation layer 24 is disposed on and covers the main body 23. The passivation layer 24 has a first surface 241 and a second surface 242 opposite to the first surface 241, and defines a plurality of openings 243 to expose the pads 25. The first surface 241 of the passivation layer 24 is the first surface 21 of the base material 2. In some embodiments, a material of the passivation layer 24 may include includes an oxide material or a nitride material such as $SiO_2$ or SiN. The inner vias 26 are disposed in the openings 243 of the passivation layer 24, and connect the pads 25. In some embodiments, each of the inner vias 26 may include a seed layer and a conductive metal. The seed layer is disposed on the sidewall of the opening 243 of the passivation layer 24 and defines a central hole. The conductive metal fills the central hole defined by the seed layer. The seed layer may include, for example, titanium and/or copper, another metal, or an alloy, and may be formed or disposed by sputtering. The conductive metal may include, for example, copper, or another metal or combination of metals, and may be formed or disposed by electroplating. As shown in FIG. 1, the top surfaces of the inner vias 26 are substantially coplanar with the first surface 241 of the passivation layer 24 (e.g., the first surface 21 of the base material 2). Thus, the inner vias 26 are exposed from the first surface 241 of the passivation layer 24 (e.g., the first surface 21 of the base material 2), and are used as electrical contacts of the base material 2. In some embodiments, a width of the inner via 26 may be about 2 μm to about 20 μm.

The electronic device (including, for example, a first electronic device 11 and a second electronic device 12) is electrically connected to the inner vias 26 of the base material 2. The electronic device may include at least one semiconductor chip, at least one package structure and/or at least one passive component. The electronic device may include a plurality of electronic devices (e.g., the first electronic device 11 and the second electronic device 12), and the at least one dummy pillar 13 and the at least one conductive pillar 14 may be disposed between two adjacent electronic devices (e.g., the first electronic device 11 and the second electronic device 12). In some embodiments, the first electronic device 11 has a first surface 111 (e.g., an active surface) and a second surface 112 (e.g., a backside surface) opposite to the first surface 111, and includes a plurality of first pads 113, a first isolation layer 114 and a plurality of first connection vias 115. The first pads 113 are disposed adjacent to the first surface 111 of the first electronic device 11. The first isolation layer 114 is disposed on and covers the first surface 111 of the first electronic device 11, and defines a plurality of opening to expose the first pads 113. The first connection vias 115 are disposed in the openings of the first isolation layer 114, and electrically connect the inner vias 26. In some embodiments, each of the first connection vias 115 may include a seed layer and a conductive metal. Similarly, the second electronic device 12 has a first surface 121 (e.g., an active surface) and a second surface 122 (e.g., a backside surface) opposite to the first surface 121, and includes a plurality of second pads 123, a second isolation layer 124 and a plurality of second connection vias 125. The second pads 123 are disposed adjacent to the first surface 121 of the second electronic device 12. The second isolation layer 124 is disposed on and covers the first surface 121 of the second electronic device 12, and defines a plurality of opening to expose the second pads 123. The second connection vias 125 are disposed in the openings of the second isolation layer 124, and electrically connect the inner vias 26. In some embodiments, each of the second connection vias 125 may include a seed layer and a conductive metal. As shown in FIG. 1, a thickness of the first electronic device 11 may be different from a thickness of the second electronic device 12. For example, the thickness of the first electronic device 11 may be greater than the thickness of the second electronic device 12.

The at least one dummy pillar 13 may be disposed on the first surface 21 of the base material 2, and may have no electrical function. That is, the dummy pillar 13 may not be electrically connected to the main body 23 or the base material 2. Alternatively, the dummy pillar 13 may terminate at or stand on the non-circuit area of the base material 2. In addition, the dummy pillar 13 may not extend through the encapsulant 10. In some embodiments, the dummy pillar 13 includes a pillar body 132 and a seed layer 131 interposed between the pillar body 132 and the first surface 21 of the base material 2. A periphery lateral surface of the pillar body 132 is substantially coplanar with a periphery lateral surface of the seed layer 131, and a size of the seed layer 131 from a top view is substantially equal to a size of the pillar body 132 from a top view. That is, the seed layer 131 only contacts a bottom surface of the pillar body 132, and does not extend to the periphery lateral surface of the pillar body 132. This is because the dummy pillar 13 is formed before the formation of the encapsulant 10. In some embodiments, the seed layer 131 may be omitted. As shown in FIG. 1, the package structure 1 may include a plurality of dummy pillars 13, and heights of the dummy pillars 13 may be equal to or different from each other. In some embodiments, a width of the dummy pillar 13 may be about 10 μm to about 30 μm, and a space between the dummy pillars 13 may be less than 10 μm.

The at least one conductive pillar 14 may be disposed on the first surface 21 of the base material 2, and have electrical function. That is, the conductive pillar 14 may be electrically connected to the main body 23 or the base material 2. Alternatively, the conductive pillar 14 may terminate at or stand on the electrical contact (e.g., the inner via) 26 in the circuit area of the base material 2. In addition, the conductive pillar 14 may extend through the encapsulant 10. In some embodiments, the conductive pillar 14 includes an upper pillar body 143, a lower pillar body 142 and a seed layer 141. The lower pillar body 142 is interposed between the upper pillar body 143 and the seed layer 141, and the seed layer 141 is interposed between the lower pillar body 142 and the first surface 21 of the base material 2. A material of the lower pillar body 142 may be the same as or different from a material the upper pillar body 143. As shown in FIG. 1, the material of the lower pillar body 142 is different from the material of the upper pillar body 143, and there is a boundary or an interface between the lower pillar body 142 and the upper pillar body 143. For example, a hardness of the upper pillar body 143 may be greater than a hardness of the lower pillar body 142. In some embodiments, a height of the lower pillar body 142 of the conductive pillar 14 is substantially equal to the height of the pillar body 132 of the dummy pillar 13, and a material of the lower pillar body 142 of the conductive pillar 14 is the same as a material of the pillar body 132 of the dummy pillar 13 since they are formed concurrently at a same stage.

A periphery lateral surface of the upper pillar body 143, a periphery lateral surface of the lower pillar body 142 and a periphery lateral surface of the seed layer 141 are substantially coplanar with each other. A size of the seed layer 141 from a top view is substantially equal to a size of the lower pillar body 142 and a size of the upper pillar body 143 from a top view. That is, the seed layer 141 only contacts a bottom surface of the lower pillar body 142, and does not extend to the periphery lateral surface of the lower pillar body 142. This is because the conductive pillar 14 is formed before the formation of the encapsulant 10. In some embodiments, the seed layer 141 may be omitted. As shown in FIG. 1, the package structure 1 may include a plurality of conductive pillars 14. In some embodiments, a width of the conductive pillar 14 may be about 10 μm to about 30 μm, and a space between the conductive pillars 14 may be less than 10 μm. A space between the conductive pillar 14 and the dummy pillar 13 may be less than 10 μm. Thus, the high density fine conductive pillars 14 that replace the solder balls of a comparative embodiment can meet the specification of the ultra-fine circuit design.

The encapsulant 10 is disposed on the first surface 21 of the base material 2, and covers the at least one electronic device (e.g., the first electronic device 11 and the second electronic device 12), the periphery lateral surface of the at least one conductive pillar 14 and a top end of the at least one dummy pillar 13. The encapsulant 10 has a first surface 101 and a second surface 102 opposite to the first surface 101. The second surface 102 of the encapsulant 10 contacts the first surface 21 of the base material 2. As shown in FIG. 1, the encapsulant 10 covers the second surface 112 and a periphery lateral surface of the first electronic device 11, the second surface 122 and a periphery lateral surface of the second electronic device 12, a periphery lateral surface of the conductive pillar 14, and a top surface and a periphery lateral surface of the dummy pillar 13. That is, the conductive pillars 14 extend through the encapsulant 10, and a top surface of each of the conductive pillars 14 is exposed from the first surface 101 of the encapsulant 10. Further, the dummy pillars 13 do not extend through the encapsulant 10, and a portion of the encapsulant 10 is disposed between the top end of the dummy pillar 13 and the upper wiring structure 3.

In some embodiments, the encapsulant 10 may include a first insulation portion 10a and a second insulation portion 10b. The first insulation portion 10a covers the electronic device (e.g., the first electronic device 11 and the second electronic device 12), the periphery lateral surface of the conductive pillar 14 and the top end of the dummy pillar 13. The second insulation portion 10b is embedded in the first insulation portion 10a. A top surface of the first insulation portion 10a is substantially coplanar with a top surface of the second insulation portion 10b and a top surface of the conductive pillar 14. The second insulation portion 10b may be discontinuous. In addition, a material of the first insulation portion 10a of the encapsulant 10 may include a non-polymer material or an inorganic material, such as an oxide material or a nitride material. For example, the material of the first insulation portion 10a of the encapsulant 10 may include $SiO_2$ or SiN, and may be formed by physical vapor deposition (PVD). Similarly, a material of the second insulation portion 10b of the encapsulant 10 may include a non-polymer material or an inorganic material, such as an oxide material or a nitride material. For example, the material of the second insulation portion 10b of the encapsulant 10 may include $SiO_2$ or SiN, and may be formed by physical vapor deposition (PVD). The material of the second insulation portion 10b of the encapsulant 10 may be the same as or different from the material of the first insulation portion 10a of the encapsulant 10.

In one embodiment, a CTE of the silicon material of the main body 23 of the base material 2 may be about 4 ppm/° C. to about 6 ppm/° C., and a CTE of the inorganic material of the encapsulant 10 may be less than 10 ppm/° C. Thus, the warpage of the package structure 1 is relatively small due to the relatively small CTE mismatch between the base material 2 and the encapsulant 10.

The upper wiring structure 3 is disposed on the first surface 101 of the encapsulant 10, and electrically connected to the base material 2 through the conductive pillars 14. As shown in FIG. 1, the upper wiring structure 3 may include a first circuit layer 15, a first dielectric layer 16, a second circuit layer 17, a second dielectric layer 18 and a third circuit layer 19. The first circuit layer 15 may be a fan-out circuit layer or a redistribution layer (RDL). The first circuit layer 15 is disposed on the first surface 101 of the encapsulant 10, and may include a plurality of traces and a plurality of pads. The pads of the first circuit layer 15 may cover and contact the top surface of the conductive pillar 14. A line width/line space (L/S) of the first circuit layer 15 may be less than or equal to about 2 μm/about 2 μm, or less than or equal to about 1.8 μm/about 1.8 μm. In some embodiments, the first circuit layer 15 may include a seed layer 151 and a metal layer 152. The seed layer 151 is disposed on the first surface 101 of the encapsulant 10, and the metal layer 152 is disposed on the seed layer 151. The seed layer 151 may include, for example, titanium and/or copper, another metal, or an alloy, and may be formed or disposed by sputtering. The metal layer 152 may include, for example, copper, or another metal or combination of metals, and may be formed or disposed by electroplating.

The first dielectric layer 16 is disposed on and covers the first circuit layer 15 and the first surface 101 of the encapsulant 10, and defines a plurality of openings 163 to expose portions of the first circuit layer 15. The first dielectric layer 16 may include, or be formed from, a photoresist layer, a passivation layer, a cured photo sensitive material, a cured photoimageable dielectric (PID) material such as epoxy or polyimide (PI) including photoinitiators, or a combination of two or more thereof. The second circuit layer 17 is disposed on the first dielectric layer 16, and may include a plurality of traces and a plurality of pads. Portions of the second circuit layer 17 may extend into the openings 163 of the first dielectric layer 16 to contact the first circuit layer 15 and forms a plurality of conductive vias. A width of each of the conductive vias of the second circuit layer 17 may be less than 20 μm. An L/S of the second circuit layer 17 may be greater than or equal to the L/S of the first circuit layer 15. In some embodiments, the second circuit layer 17 may include a seed layer 171 and a metal layer 172 disposed on the seed layer 171. Further, the second dielectric layer 18 is disposed on and covers the second circuit layer 17 and the first dielectric layer 16, and defines a plurality of openings 183 to expose portions of the second circuit layer 17. A material of the second dielectric layer 18 may be the same as or different from a material of the first dielectric layer 16. In addition, the third circuit layer 19 is disposed on the second dielectric layer 18, and may include a plurality of under bump metallurgies (UBMs) disposed in the openings 183 of the second dielectric layer 18 to contact the second circuit layer 17. In some embodiments, the third circuit layer 19 may include a seed layer 191 and a metal layer 192 disposed on the seed layer 191.

The at least one external connector 34 is disposed on and electrically connected to the upper wiring structure 3. As shown in FIG. 1, the package structure 1 includes a plurality of external connectors 34 for external connection. The external connectors 34 may be solder balls that are disposed on and electrically connected to respective ones of the under bump metallurgies (UBMs) of the third circuit layer 19 of the upper wiring structure 3.

Figure 2:
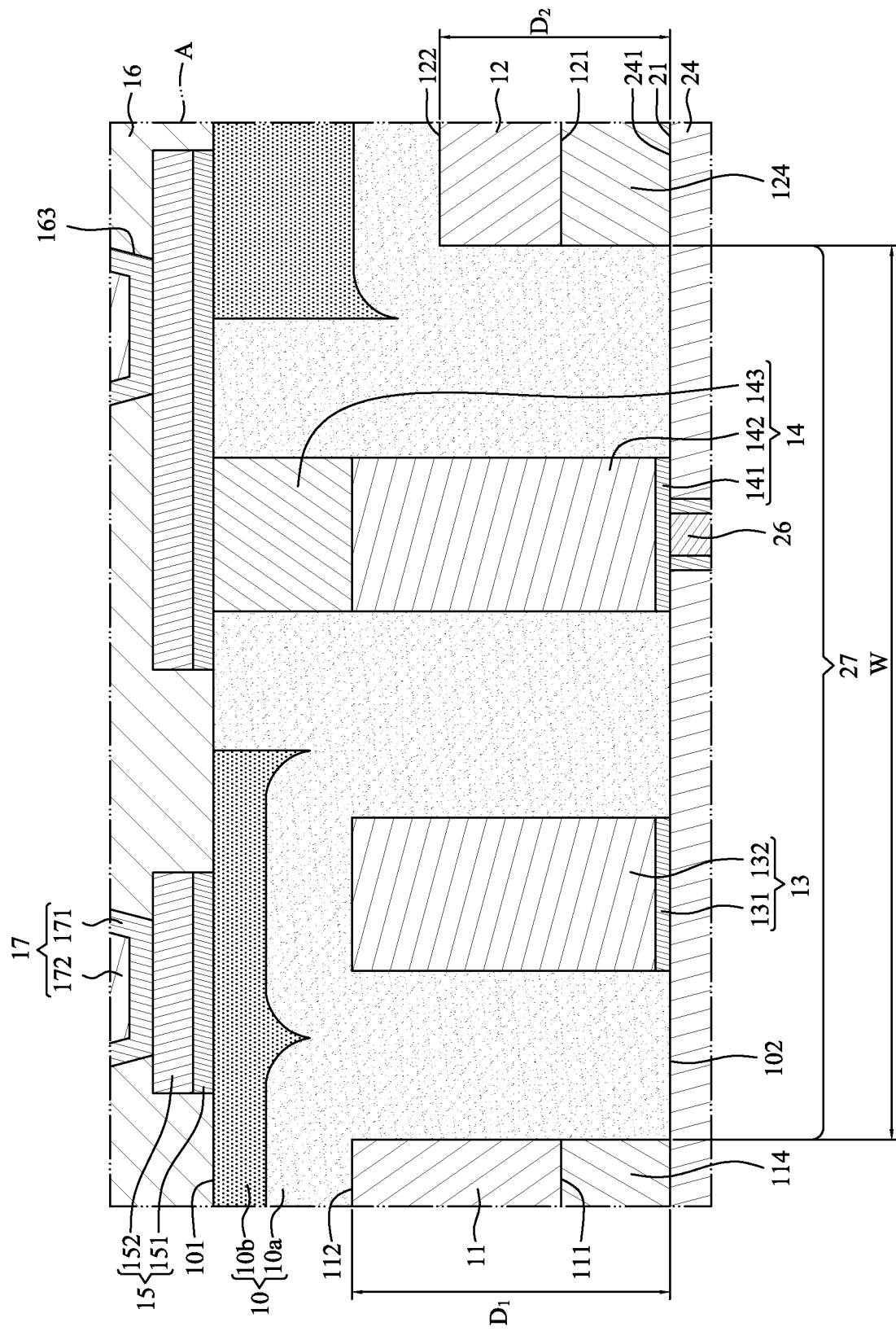
FIG. 2 illustrates an enlarged view of a region "A" in FIG. 1.

FIG. 2 illustrates an enlarged view of a region "A" in FIG. 1. A distance between a top surface (e.g., the second surface 112) of the first electronic device 11 and a top surface (e.g., the first surface 21) of the base material 2 is defined as a first distance $D_1$. A distance between a top surface (e.g., the second surface 122) of the second electronic device 12 and the top surface (e.g., the first surface 21) of the base material 2 is defined as a second distance $D_2$. The first distance $D_1$ may be equal to or different from the second distance $D_2$. In some embodiments, width W of a gap 27 between the first electronic device 11 and the second electronic device 12 is greater than 0.45 times a sum of the first distance $D_1$ and the second distance $D_2$. That is, $W>0.45(D_1+D_2)$. In a comparative embodiment, according to experience and knowledge of those skilled in the art, if the conductive pillar(s) 14 and the dummy pillar(s) 13 between the first electronic device 11 and the second electronic device 12 are omitted, the encapsulant 10 will define a deep dimple in the gap 27 since the encapsulant 10 may be formed by deposition. Such deep dimple is recessed from a top surface (e.g., the first surface 101) of the encapsulant 10. When an external force is applied to the package structure 1 (such as a contact or hit to the package structure 1 during transportation), a defect (e.g., a crack or a void) will occur and extend from a bottom of the deep dimple into the interior of the package structure 1. Thus, the functions of the first electronic device 11 and the second electronic device 12 will be adversely affected. In another comparative embodiment, if only one conductive pillar 14 or only one row of conductive pillars 14 is/are disposed between the first electronic device 11 and the second electronic device 12, such dimple cannot be eliminated completely. Therefore, in the package structure 1 illustrated in FIG. 1 and FIG. 2, the dummy pillar(s) 13 is/are disposed between the first electronic device 11 and the second electronic device 12, such dimple can be eliminated completely, and the defect (e.g., a crack or a void) can be avoided. Further, the material of the dummy pillar(s) 13 may be solid metal, thus, the strength of the total package structure 1 is improved. In addition, the encapsulant 10 may include two or more insulation portions (e.g., the first insulation portion 10a and the second insulation portion 10b); thus, an internal stress of the encapsulant 10 may be reduced. In some embodiments, the conductive pillar 14 may be a multi-pillar that may include two or more pillar bodies (e.g., the upper pillar body 143 and the lower pillar body 142); thus, the entire top surface of the conductive pillar 14 may be exposed from the top surface (e.g., the first surface 101) of the encapsulant 10 after a grinding process, and the reliability of the bonding between the conductive pillar(s) 14 and the upper wiring structure 3 is improved. In addition, in some embodiments, the dummy pillar(s) 13 (and the conductive pillar(s) 14) is/are formed on the base material 2 before the formation of the encapsulant 10; thus, a bonding force between the dummy pillar(s) 13 and the base material 2 is greater than a bonding force between the dummy pillar(s) 13 and the base material 2 in a comparative embodiment in which the dummy pillar(s) 13 is/are formed on the base material 2 after the formation of the encapsulant 10.

Figure 3:
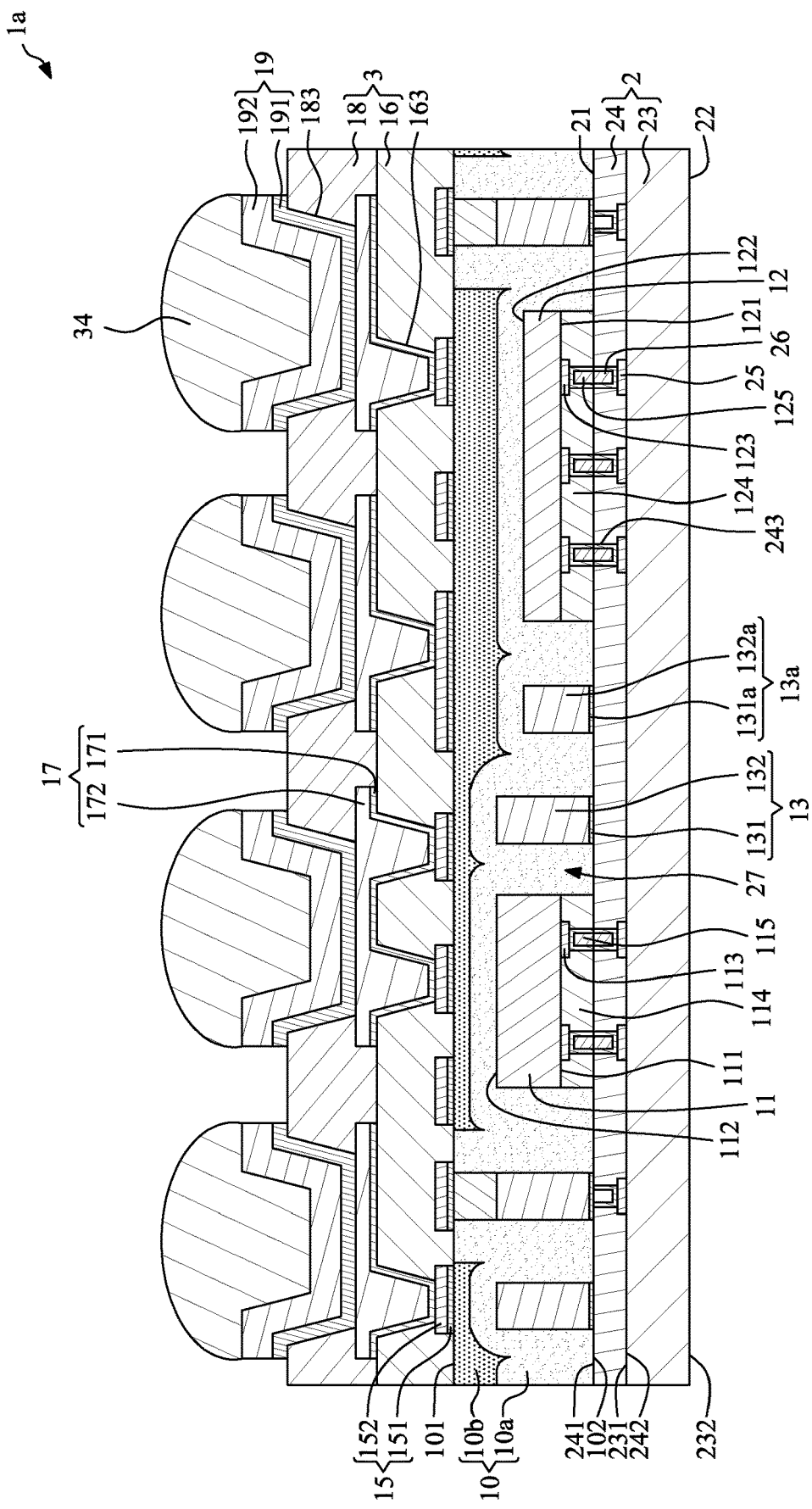
FIG. 3 illustrates a cross-sectional view of a package structure according to some embodiments of the present disclosure.

FIG. 3 illustrates a cross-sectional view of a package structure 1a according to some embodiments of the present disclosure. The package structure 1a is similar to the package structure 1 shown in FIG. 1, except that the conductive pillar(s) 14 disposed between the first electronic device 11 and the second electronic device 12 shown in FIG. 1 is/are replaced by the dummy pillar(s) 13a shown in FIG. 3. Thus, only dummy pillar(s) 13, 13a is/are disposed between the first electronic device 11 and the second electronic device 12, and there is no conductive pillar 14 disposed between the first electronic device 11 and the second electronic device 12. In some embodiments, the dummy pillar 13a may be disposed on the first surface 21 of the base material 2, and may have no electrical function. That is, the dummy pillar 13a may not be electrically connected to the main body 23 or the base material 2. In addition, the dummy pillar 13a may not extend through the encapsulant 10. In some embodiments, the dummy pillar 13a includes a pillar body 132a and a seed layer 131a interposed between the pillar body 132a and the first surface 21 of the base material 2. A periphery lateral surface of the pillar body 132a is substantially coplanar with a periphery lateral surface of the seed layer 131a, and a size of the seed layer 131a from a top view is substantially equal to a size of the pillar body 132a from a top view. As shown in FIG. 3, a height of the dummy pillar(s) 13 near the thicker first electronic device 11 is greater than a height of the dummy pillar(s) 13a near the thinner second electronic device 12.

Figure 4:
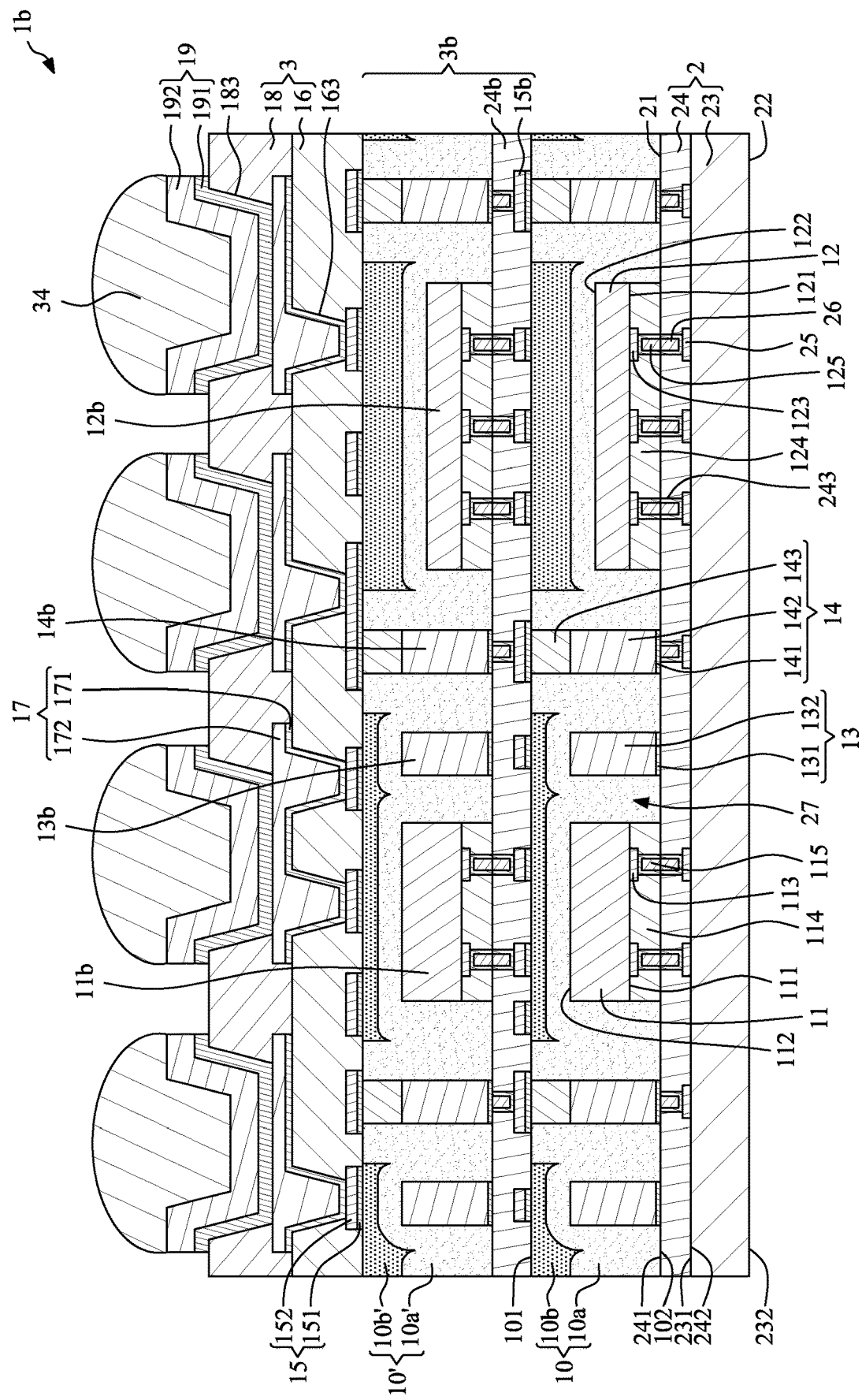
FIG. 4 illustrates a cross-sectional view of a package structure according to some embodiments of the present disclosure.

FIG. 4 illustrates a cross-sectional view of a package structure 1b according to some embodiments of the present disclosure. The package structure 1b is similar to the package structure 1 shown in FIG. 1, except that a conductive structure 3b is further interposed between the upper wiring structure 3 and the encapsulant 10. The conductive structure 3b may include a fourth circuit layer 15b, an upper passivation layer 24b, a first electronic device 11b, a second electronic device 12b, at least one dummy pillar 13b, at least one conductive pillar 14b and an upper encapsulant 10'. The fourth circuit layer 15b is disposed on the first surface 101 of the encapsulant 10, and may include a plurality of traces and a plurality of pads. The upper passivation layer 24b covers the fourth circuit layer 15b and the first surface 101 of the encapsulant 10, and may include a plurality of inner vias extending through the upper passivation layer 24b and contacting the fourth circuit layer 15b. The first electronic device 11b and the second electronic device 12b are substantially the same as the first electronic device 11 and the second electronic device 12, respectively. The first electronic device 11b and the second electronic device 12b are electrically connected to the inner vias of the upper passivation layer 24b. The at least one dummy pillar 13b and the at least one conductive pillar 14b are substantially the same as the dummy pillar 13 and the conductive pillar 14, respectively. The dummy pillar(s) 13b may be disposed on the top surface of the upper passivation layer 24b, and may have no electrical function. In addition, the dummy pillar 13b may not extend through the encapsulant 10'. The conductive pillar(s) 14b may be disposed on the top surface of the upper passivation layer 24b, and have electrical function. That is, the conductive pillar 14b may be electrically connected to the fourth circuit layer 15b. In addition, the conductive pillar 14b may extend through the encapsulant 10'.

The encapsulant 10' is disposed on the top surface of the upper passivation layer 24b, and covers the first electronic device 11b and the second electronic device 12b, the periphery lateral surface of the conductive pillar 14b and a top end of the dummy pillar 13b. In some embodiments, the encapsulant 10' may include a first insulation portion 10a' and a second insulation portion 10b' that are substantially the same as the first insulation portion 10a and the second insulation portion 10b, respectively.

Figure 5:
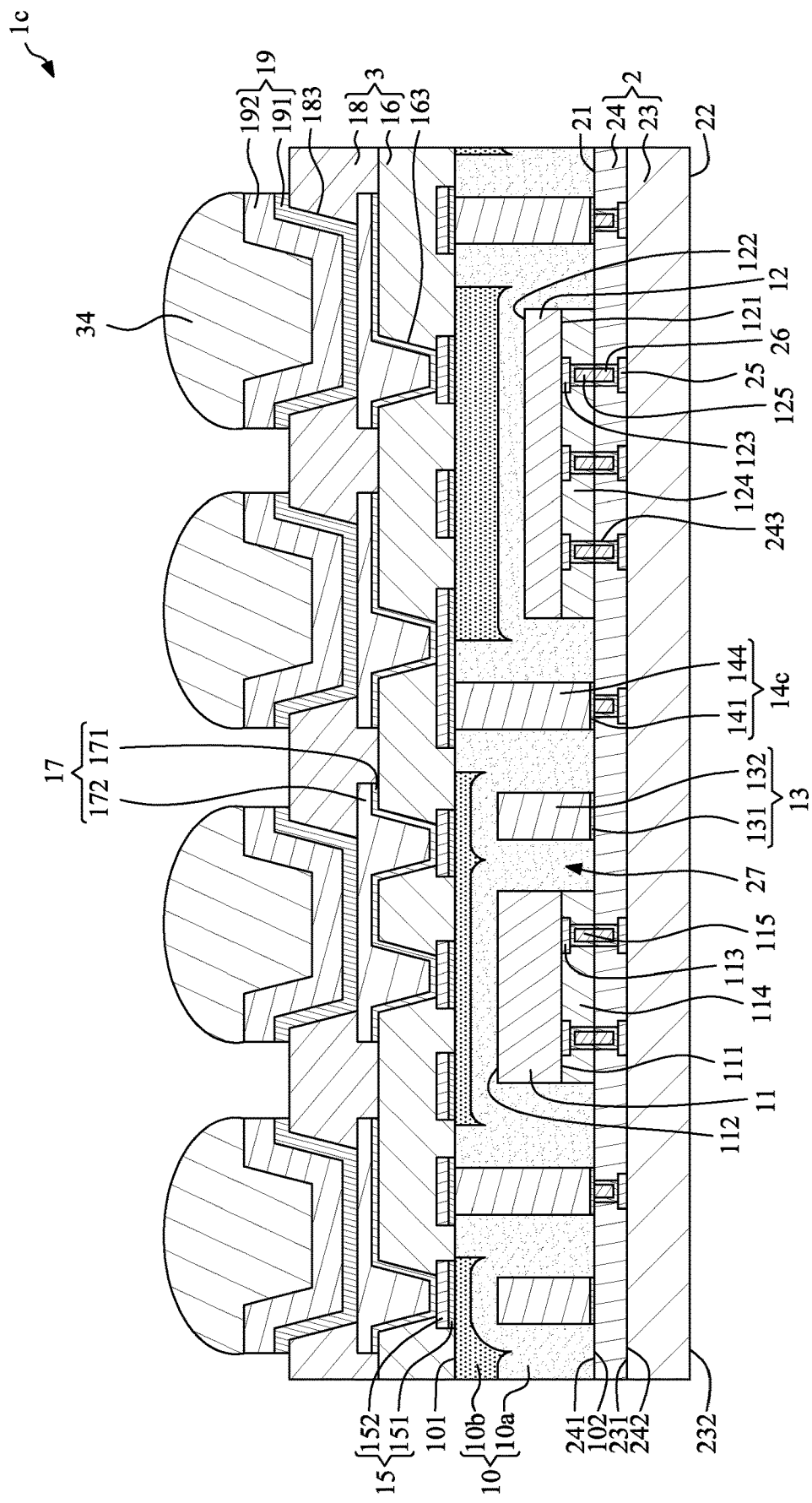
FIG. 5 illustrates a cross-sectional view of a package structure according to some embodiments of the present disclosure.

FIG. 5 illustrates a cross-sectional view of a package structure 1c according to some embodiments of the present disclosure. The package structure 1c is similar to the package structure 1 shown in FIG. 1, except for the structures of the conductive pillars 14c. As shown in FIG. 5, the conductive pillar 14c includes a seed layer 141 and a pillar body 144. One end of the pillar body 144 contacts the seed layer 141, and the other end of the pillar body 144 contacts the seed layer 151 of the first circuit layer 15. That is, the pillar body 144 of the conductive pillar 14c is a monolithic structure.

Figure 6:
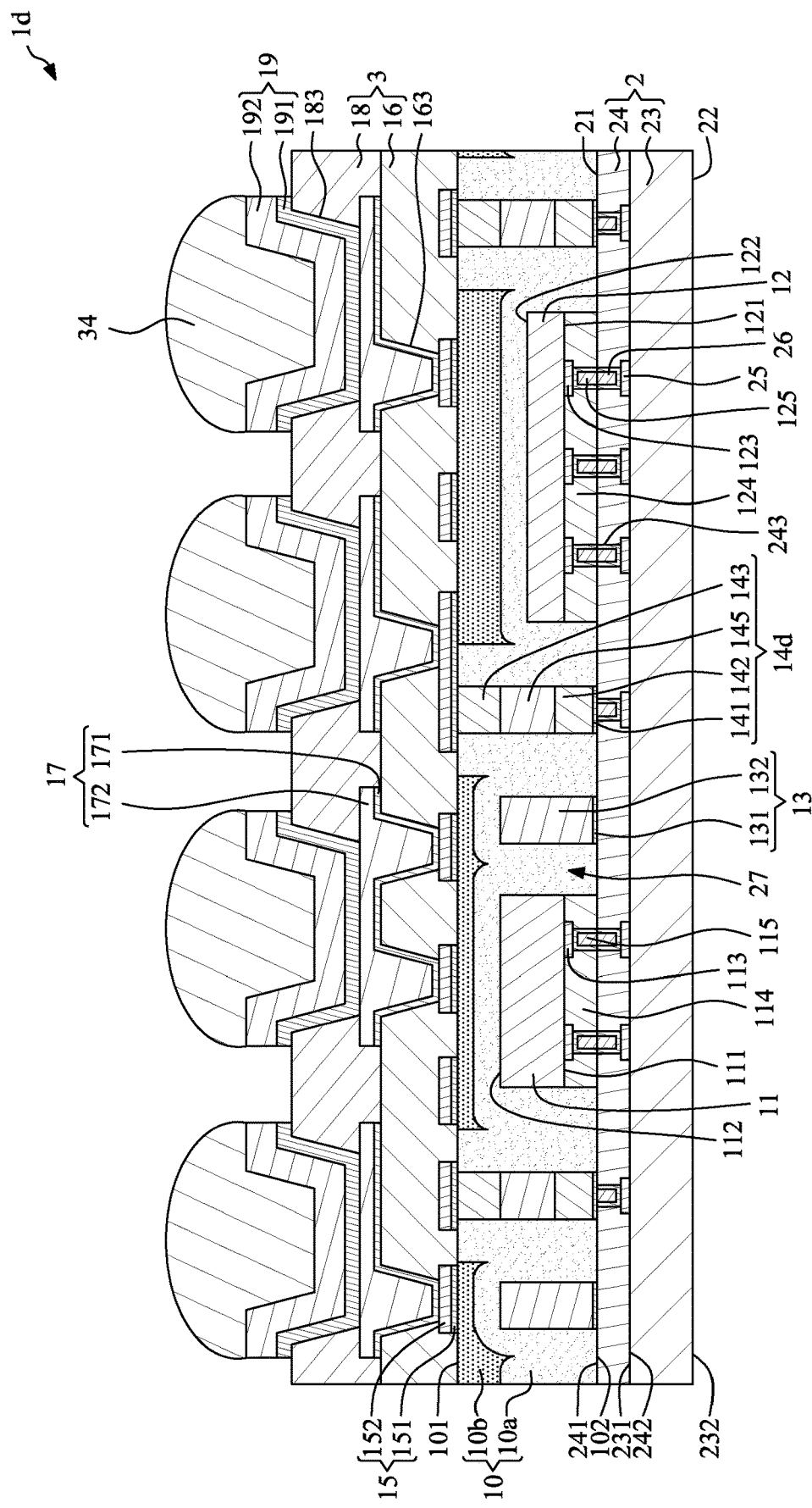
FIG. 6 illustrates a cross-sectional view of a package structure according to some embodiments of the present disclosure.

FIG. 6 illustrates a cross-sectional view of a package structure 1d according to some embodiments of the present disclosure. The package structure 1d is similar to the package structure 1 shown in FIG. 1, except for the structures of the conductive pillars 14d. As shown in FIG. 6, the conductive pillar 14d includes a seed layer 141, a lower pillar body 142, an upper pillar body 143 and an intermediate pillar body 145. The seed layer 141, the lower pillar body 142 and the upper pillar body 143 of the conductive pillar 14d of FIG. 6 is similar to the seed layer 141, the lower pillar body 142 and the upper pillar body 143 of the conductive pillar 14 of FIG. 1, respectively. The intermediate pillar body 145 is interposed between the lower pillar body 142 and the upper pillar body 143.

Figure 7:
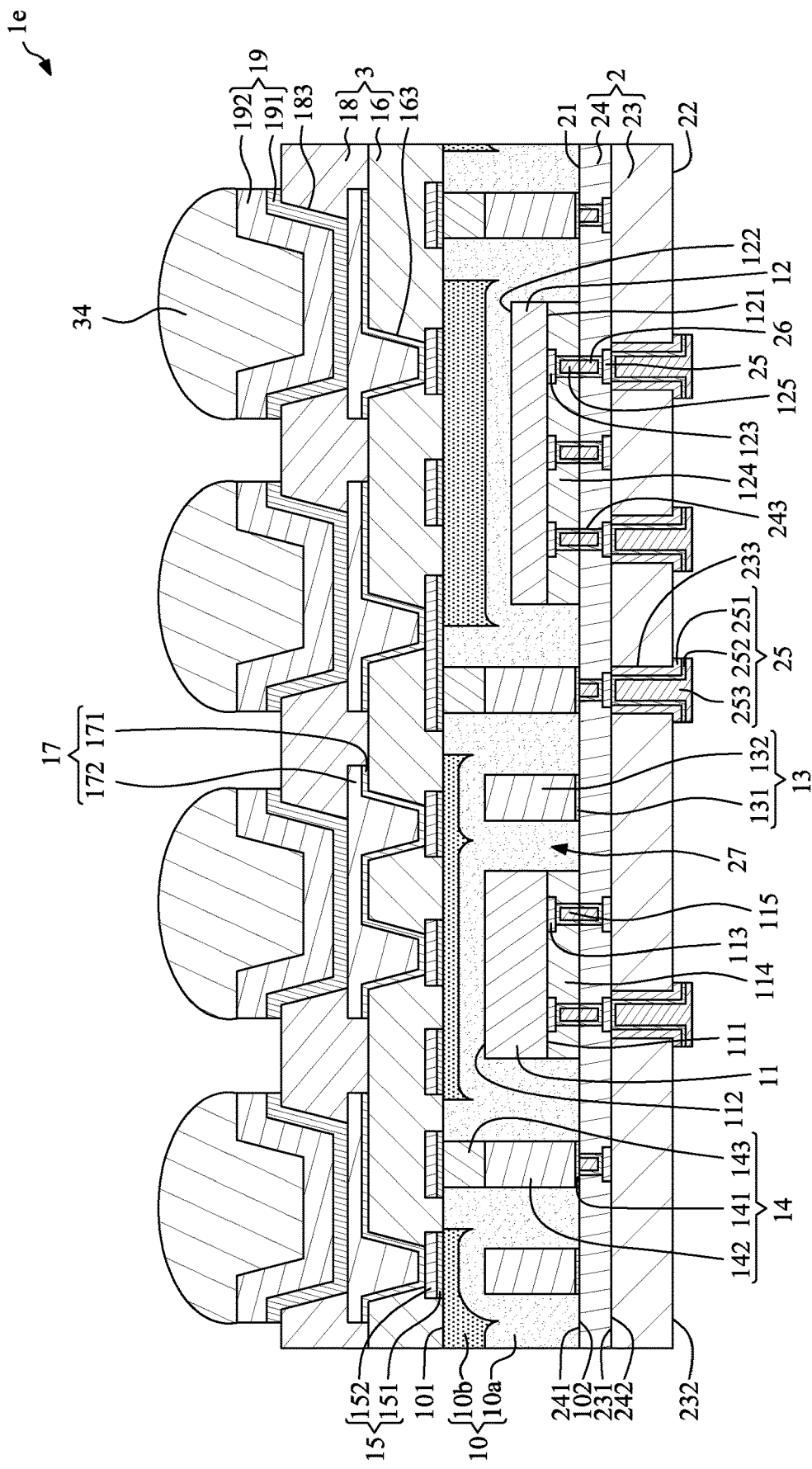
FIG. 7 illustrates a cross-sectional view of a package structure according to some embodiments of the present disclosure.

FIG. 7 illustrates a cross-sectional view of a package structure 1e according to some embodiments of the present disclosure. The package structure 1e is similar to the package structure 1 shown in FIG. 1, except for a structure of the main body 23 of the base material 2. As shown in FIG. 7, the main body 23 defines a plurality of openings 233 to expose the pads 25, and includes a lower circuit layer 25. A portion of the lower circuit layer 25 is disposed on the second surface 232 of the main body 23 to form at least one lower pad, and another portion of the lower circuit layer 25 is disposed in the openings 233 to contact the pads 25 to form at least one lower via. In some embodiments, the lower circuit layer 25 may include a dielectric layer 251, a seed layer 252 and a metal layer 253. A portion of the dielectric layer 251 is disposed on the sidewall of the opening 233 and defines a central hole, and another portion of the dielectric layer 251 is disposed on the second surface 232 of the main body 23. The seed layer 252 is disposed on the dielectric layer 251 and does not fill the central hole. The metal layer 253 is disposed on the seed layer 252 and fills the central hole.

Figure 8:
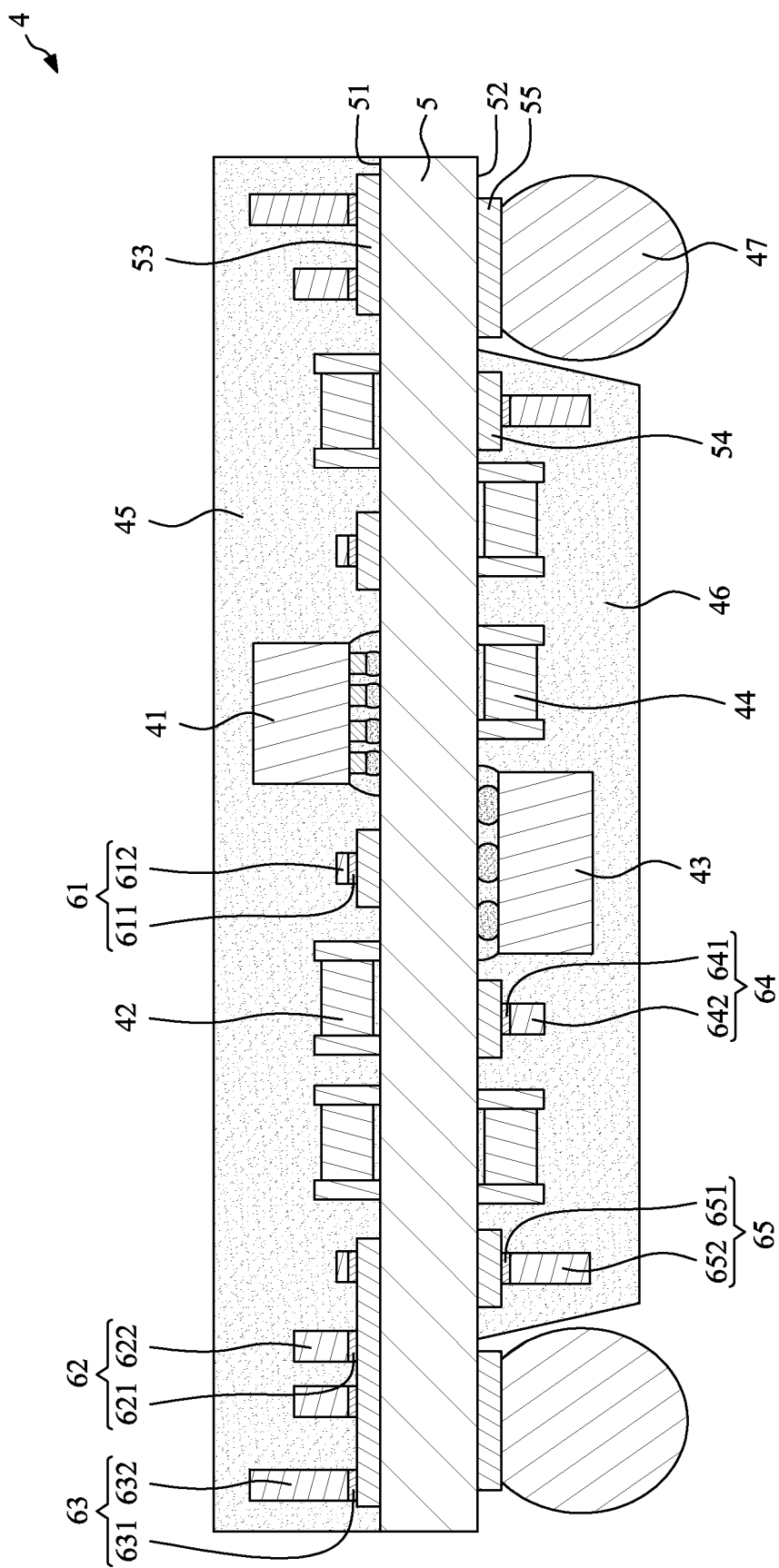
FIG. 8 illustrates a cross-sectional view of a package structure according to some embodiments of the present disclosure.

FIG. 8 illustrates a cross-sectional view of a package structure 4 according to some embodiments of the present disclosure. The package structure 4 may be a double-side molded structure, and includes a base material 5, at least one electronic device (including, for example, at least one first upper electronic device 41, at least one second upper electronic device 42, at least one first lower electronic device 43 and at least one second lower electronic device 44), at least one encapsulant (including, for example, an upper encapsulant 45 and a lower encapsulant 46) and a plurality of dummy pillars (including, for example, at least one first upper dummy pillar 61, at least one second upper dummy pillar 62, at least one third upper dummy pillar 63, at least one first lower dummy pillar 64, at least one second lower dummy pillar 65) and at least one external connector 47.

The base material 5 may be a package substrate or a printed circuit board. A material of the base material 5 may be organic such as bismaleimide triazine (BT), FR4 or FR5. The base material 5 has an upper surface 51 and a lower surface 52 opposite to the upper surface 51, and includes an upper circuit layer disposed adjacent to or disposed on the upper surface 51 and a lower circuit layer disposed adjacent to or disposed on the lower surface 52. The upper circuit layer may include a plurality of traces, a plurality of conductive pads and a plurality of pillar pads 53. In some embodiments, the pillar pads 53 may be electrically isolated from the traces and the conductive pads. Further, the lower circuit layer may include a plurality of traces, a plurality of conductive pads, a plurality of pillar pads 54 and a plurality of bonding pads 55. In some embodiments, the pillar pads 54 may be electrically isolated from the traces, the conductive pads and the bonding pads 55.

The first upper electronic device 41 and the second upper electronic device 42 are electrically connected to the upper circuit layer on the upper surface 51 of the base material 5. In some embodiments, the first upper electronic device 41 may be a semiconductor chip, and the second upper electronic device 42 may be a passive component. The first lower electronic device 43 and the second lower electronic device 44 are electrically connected to the lower circuit layer on the lower surface 52 of the base material 5. In some embodiments, the first lower electronic device 43 may be a semiconductor chip, and the second lower electronic device 44 may be a passive component.

The dummy pillars (including, for example, the first upper dummy pillar 61, the second upper dummy pillar 62, the third upper dummy pillar 63, the first lower dummy pillar 64 and the second lower dummy pillar 65) may have no electrical function. The first upper dummy pillar 61, the second upper dummy pillar 62 and the third upper dummy pillar 63 are disposed on the pillar pads 53. At least two or three of the dummy pillars 61, 62, 63 have different heights. As shown in FIG. 8, a height of the dummy pillar near the center of the base material 5 is less than a height of the dummy pillar away from the center of the base material 5. For example, the first upper dummy pillar 61 is nearer to or closer to the center of the base material 5 than the second upper dummy pillar 62 is. Thus, a height of the first upper dummy pillar 61 is less than a height of the second upper dummy pillar 62. Further, the second upper dummy pillar 62 is nearer to or closer to the center of the base material 5 than the third upper dummy pillar 63 is. Thus, a height of the second upper dummy pillar 62 is less than a height of the third upper dummy pillar 63. Similarly, the first lower dummy pillar 64 and the second lower dummy pillar 65 are disposed on the pillar pads 54. The dummy pillars 64, 65 have different heights. For example, the first lower dummy pillar 64 is nearer to or closer to the center of the base material 5 than the second lower dummy pillar 65 is. Thus, a height of the first lower dummy pillar 64 is less than a height of the second lower dummy pillar 65.

As shown in FIG. 8, the dummy pillars 61, 62, 63 may not extend through the upper encapsulant 45, and the dummy pillars 64, 65 may not extend through the lower encapsulant 46. Thus, the dummy pillars 61, 62, 63 may not exposed from the upper encapsulant 45, and the dummy pillars 64, 65 may not exposed from the lower encapsulant 46. In addition, a structure of each the dummy pillars 61, 62, 63, 64, 65 is similar to a structure of the dummy pillar 13 of FIG. 1. In some embodiments, the first upper dummy pillar 61 includes a pillar body 612 and a seed layer 611 interposed between the pillar body 612 and the pillar pad 53. A periphery lateral surface of the pillar body 612 is substantially coplanar with a periphery lateral surface of the seed layer 611, and a size of the seed layer 611 from a top view is substantially equal to a size of the pillar body 612 from a top view. In some embodiments, the seed layer 611 may be omitted. Further, the second upper dummy pillar 62 includes a pillar body 622 and a seed layer 621 interposed between the pillar body 622 and the pillar pad 53. The third upper dummy pillar 63 includes a pillar body 632 and a seed layer 631 interposed between the pillar body 632 and the pillar pad 53. The first lower dummy pillar 64 includes a pillar body 642 and a seed layer 641 interposed between the pillar body 642 and the pillar pad 54. The second lower dummy pillar 65 includes a pillar body 652 and a seed layer 651 interposed between the pillar body 652 and the pillar pad 54.

As shown in FIG. 8, the dummy pillars 61, 62, 63, 64, 65 have the same width. However, in other embodiments, the dummy pillars 61, 62, 63, 64, 65 may have different widths. In one embodiment, a width of the dummy pillar near the center of the base material 5 is less than a width of the dummy pillar away from the center of the base material 5. For example, the first upper dummy pillar 61 is nearer to or closer to the center of the base material 5 than the second upper dummy pillar 62 is. Thus, a width of the first upper dummy pillar 61 is less than a width of the second upper dummy pillar 62. Further, the second upper dummy pillar 62 is nearer to or closer to the center of the base material 5 than the third upper dummy pillar 63 is. Thus, a width of the second upper dummy pillar 62 is less than a width of the third upper dummy pillar 63. Similarly, the first lower dummy pillar 64 is nearer to or closer to the center of the base material 5 than the second lower dummy pillar 65 is. Thus, a width of the first lower dummy pillar 64 is less than a width of the second lower dummy pillar 65.

In one embodiment, a width of the dummy pillar near the center of the base material 5 is greater than a width of the dummy pillar away from the center of the base material 5. For example, the first upper dummy pillar 61 is nearer to or closer to the center of the base material 5 than the second upper dummy pillar 62 is. Thus, a width of the first upper dummy pillar 61 is greater than a width of the second upper dummy pillar 62. Further, the second upper dummy pillar 62 is nearer to or closer to the center of the base material 5 than the third upper dummy pillar 63 is. Thus, a width of the second upper dummy pillar 62 is greater than a width of the third upper dummy pillar 63. Similarly, the first lower dummy pillar 64 is nearer to or closer to the center of the base material 5 than the second lower dummy pillar 65 is. Thus, a width of the first lower dummy pillar 64 is greater than a width of the second lower dummy pillar 65.

The upper encapsulant 45 covers the upper electronic devices (e.g., the first upper electronic device 41 and the second upper electronic device 42) and the upper dummy pillars (e.g., the first upper dummy pillar 61, the second upper dummy pillar 62 and the third upper dummy pillar 63). Thus, the upper dummy pillars (e.g., the first upper dummy pillar 61, the second upper dummy pillar 62 and the third upper dummy pillar 63) are embedded in the upper encapsulant 45. Similarly, the lower encapsulant 46 covers the lower electronic devices (e.g., the first lower electronic device 43 and the second lower electronic device 44) and the lower dummy pillars (e.g., the first lower dummy pillar 64 and the second lower dummy pillar 65). Thus, the lower dummy pillars (e.g., the first lower dummy pillar 64 and the second lower dummy pillar 65) are embedded in the lower encapsulant 46. The upper encapsulant 45 and the lower encapsulant 46 may be molding compounds with or without fillers.

As shown in FIG. 8, the lower encapsulant 46 does not cover the bonding pads 55. The external connectors 47 (such as solder balls) are disposed on and electrically connected to the bonding pads 55 on the lower surface 52 of the base material 5. Alternatively, the upper circuit layer of the base material 5 may further include a plurality of bonding pads that are not covered by the upper encapsulant 45, and the external connectors 47 may be disposed on and electrically connected to the bonding pads on the upper surface 51 of the base material 5.

In the embodiment illustrated in FIG. 8, a height of the dummy pillar away from the center of the base material 5 is greater than a height of the dummy pillar near the center of the base material 5. In a comparative embodiment without the dummy pillars 61, 62, 63, 64, 65, a warpage may occur to the package structure due to the CTE mismatch between the base material 5 and the encapsulants 45, 46. The periphery of the base material 5 may have a largest warpage, and the center of the base material 5 may have a smallest warpage. Thus, the arrangement of the dummy pillars 61, 62, 63, 64, 65 of FIG. 8 may balance and reduce such warpage. Further, the material of the dummy pillars 61, 62, 63, 64, 65 may be solid metal, which may improve the strength of the package structure 4. In addition, the dummy pillars 61, 62, 63, 64, 65 embedded in the encapsulants 45, 46 may improve the adhesion between the encapsulants 45, 46 and the base material 5

FIG. 9 through FIG. 24 illustrate a method for manufacturing a package structure according to some embodiments of the present disclosure. In some embodiments, the method is for manufacturing the package structure 1 shown in FIG. 1.

Figure 9:
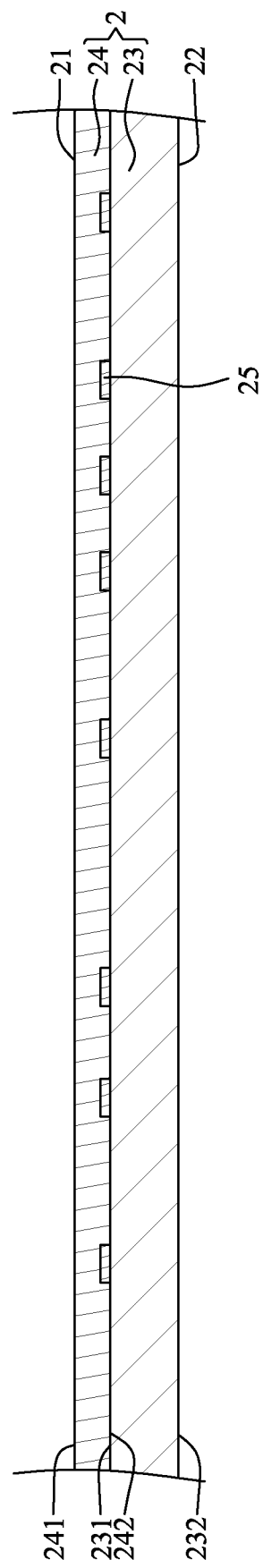
FIG. 9 illustrates one or more stages of an example of a method for manufacturing a package structure according to some embodiments of the present disclosure.

Referring to FIG. 9, a base material 2 is provided. The base material 2 has a first surface 21 and a second surface 22 opposite to the first surface 21. The base material 2 may be a carrier, and a shape of the base material 2 may be, for example, substantially circular, elliptical, rectangular or square. In some embodiments, the base material 2 includes a main body 23 and a passivation layer 24. The main body 23 has a first surface 231 and a second surface 232 opposite to the first surface 231, and includes a plurality of pads 25 disposed adjacent to the first surface 231. The passivation layer 24 is disposed on and covers the main body 23. The passivation layer 24 has a first surface 241 and a second surface 242 opposite to the first surface 241, and defines a plurality of openings 243 to expose the pads 25.

Figure 10:
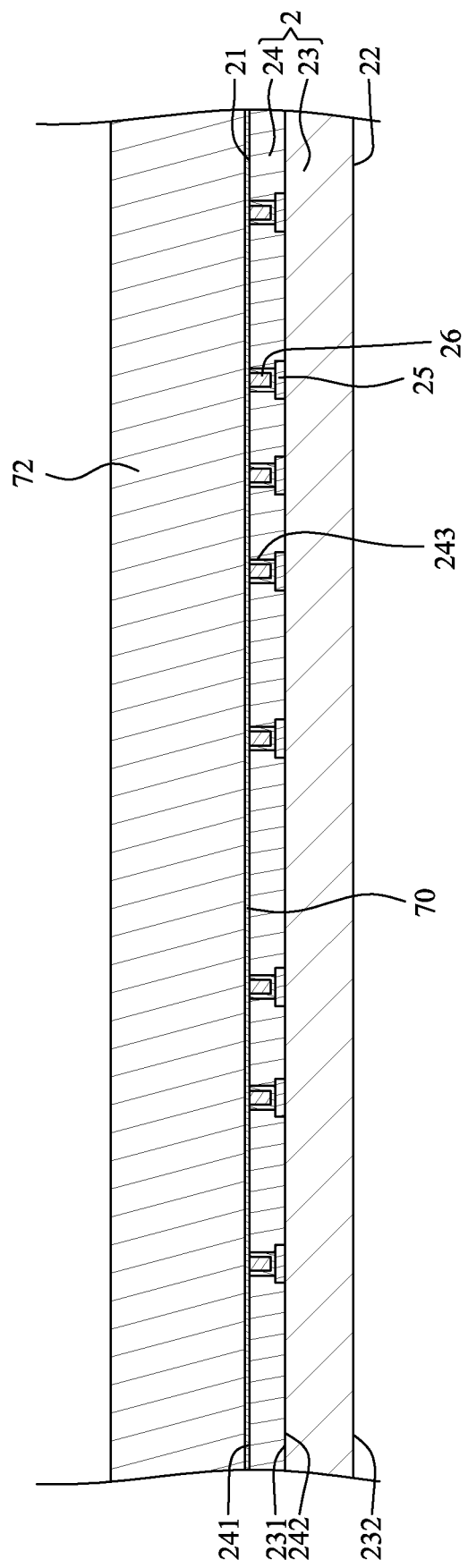
FIG. 10 illustrates one or more stages of an example of a method for manufacturing a package structure according to some embodiments of the present disclosure.

Referring to FIG. 10, a plurality of openings 243 are formed in the passivation layer 24 to expose the pads 25. Then, a plurality of inner vias 26 are formed or disposed in the openings 243 of the passivation layer 24, and connect the pads 25. In some embodiments, each of the inner vias 26 may include a seed layer and a conductive metal. Then, a grinding process is conducted to the first surface 21 of the base material 2. Thus, the top surfaces of the inner vias 26 are substantially coplanar with the first surface 241 of the passivation layer 24 (e.g., the first surface 21 of the base material 2). The inner vias 26 are exposed from the first surface 241 of the passivation layer 24 (e.g., the first surface 21 of the base material 2), and are used as electrical contacts of the base material 2. Then, a seed layer 70 is formed or disposed on the first surface 21 of the base material 2 to cover the top surfaces of the inner vias 26 and the first surface 241 of the passivation layer 24 by a physical vapor deposition (PVD) technique or other suitable techniques. Then, a first photoresist layer 72 is formed or disposed on the seed layer 70.

Figure 11:
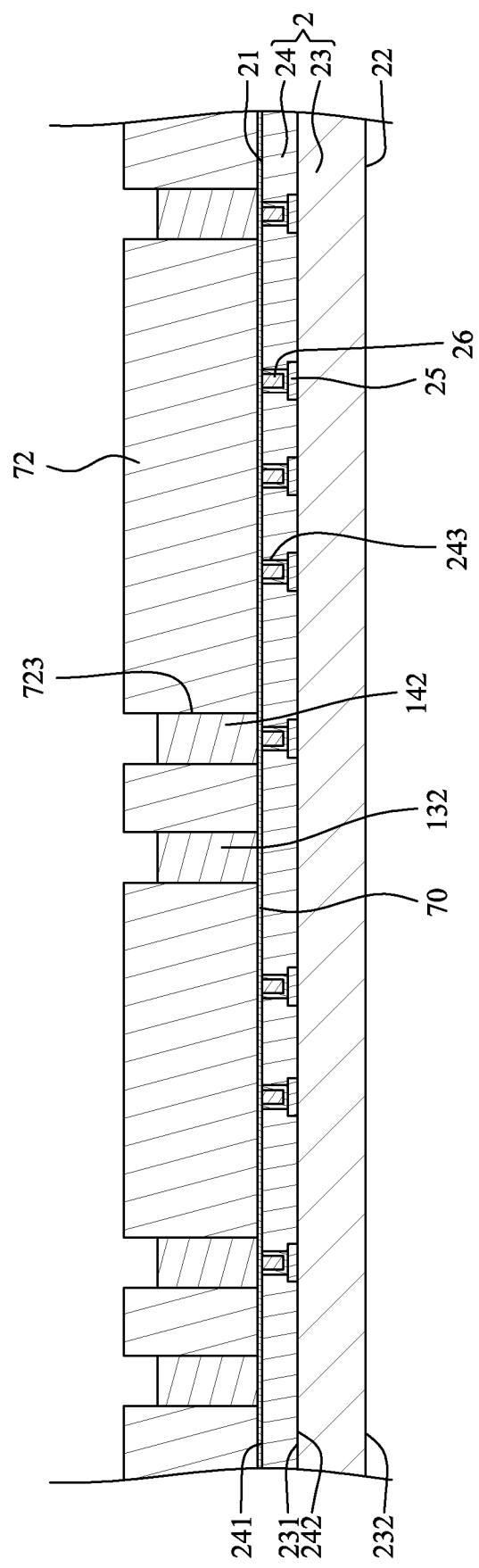
FIG. 11 illustrates one or more stages of an example of a method for manufacturing a package structure according to some embodiments of the present disclosure.

Referring to FIG. 11, a plurality of opening 723 is formed in the first photoresist layer 72 to expose portions of the seed layer 70. Then, a first metal material is formed or disposed in the opening 723 of the first photoresist layer 72 by, for example, plating, so as to contact the exposed portions of the seed layer 70 and form at least one pillar body 132 and at least one lower pillar body 142. The lower pillar body 142 corresponds to the inner via 26.

Figure 12:
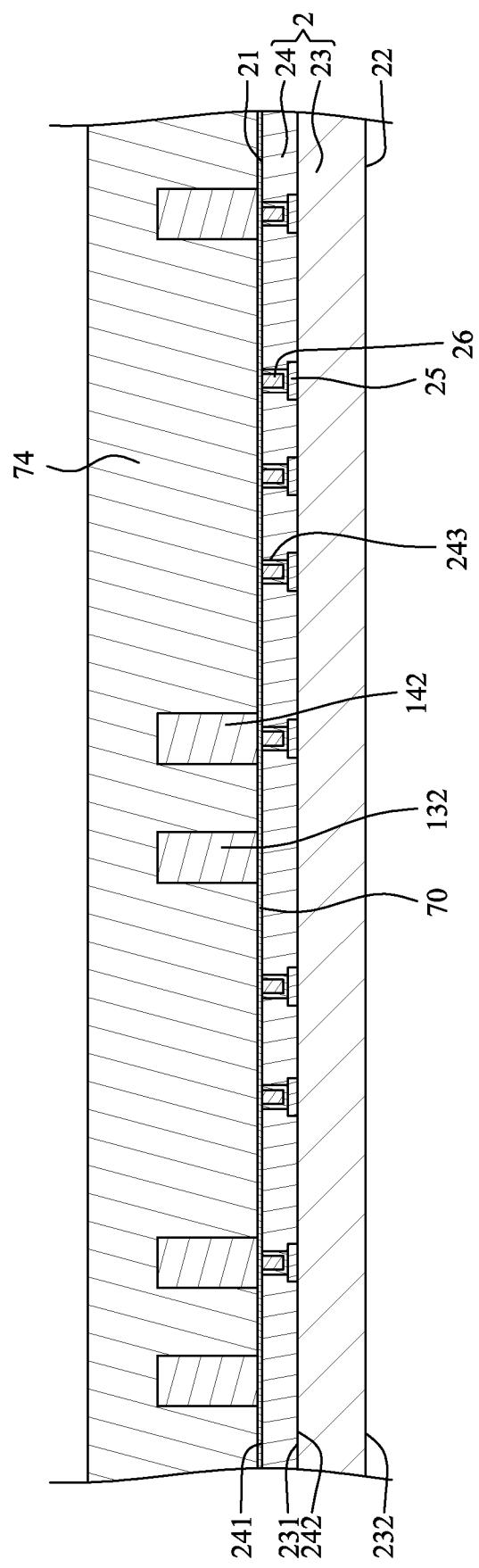
FIG. 12 illustrates one or more stages of an example of a method for manufacturing a package structure according to some embodiments of the present disclosure.

Referring to FIG. 12, the first photoresist layer 72 is removed. Then, a second photoresist layer 74 is formed or disposed on the seed layer 70 to cover the pillar body 132 and the lower pillar body 142.

Figure 13:
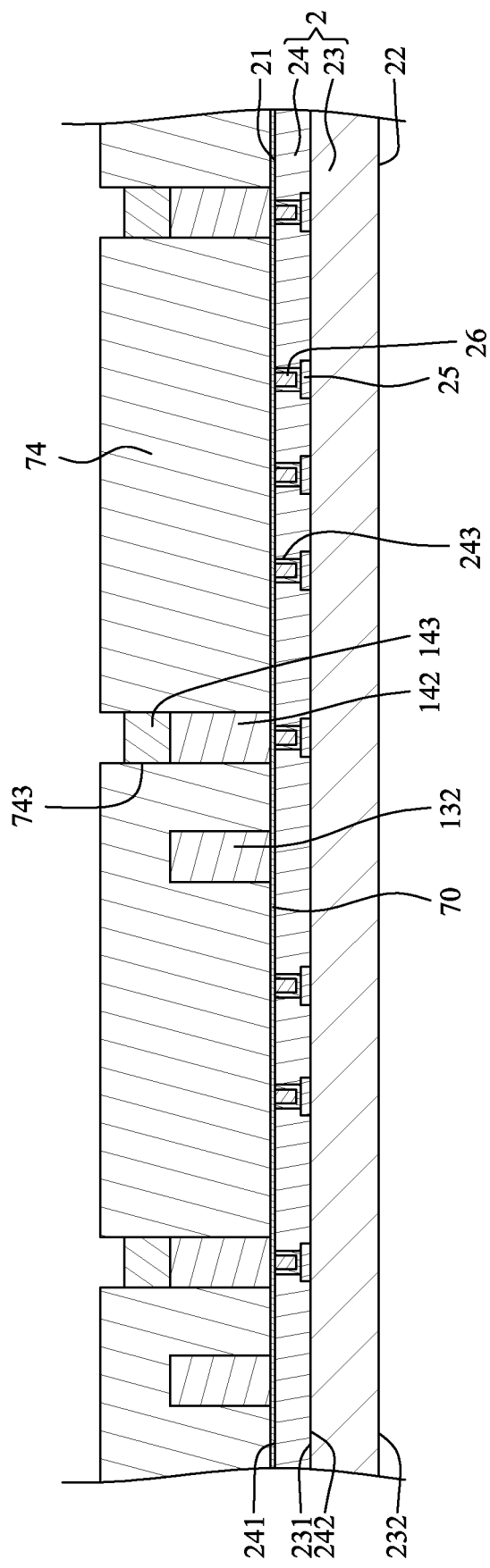
FIG. 13 illustrates one or more stages of an example of a method for manufacturing a package structure according to some embodiments of the present disclosure.

Referring to FIG. 13, a plurality of opening 743 is formed in the second photoresist layer 74 to expose the lower pillar body 142. Then, a second metal material is formed or disposed in the opening 743 of the second photoresist layer 74 by, for example, plating, so as to contact the exposed lower pillar body 142 and form at least one upper pillar body 143.

Figure 14:
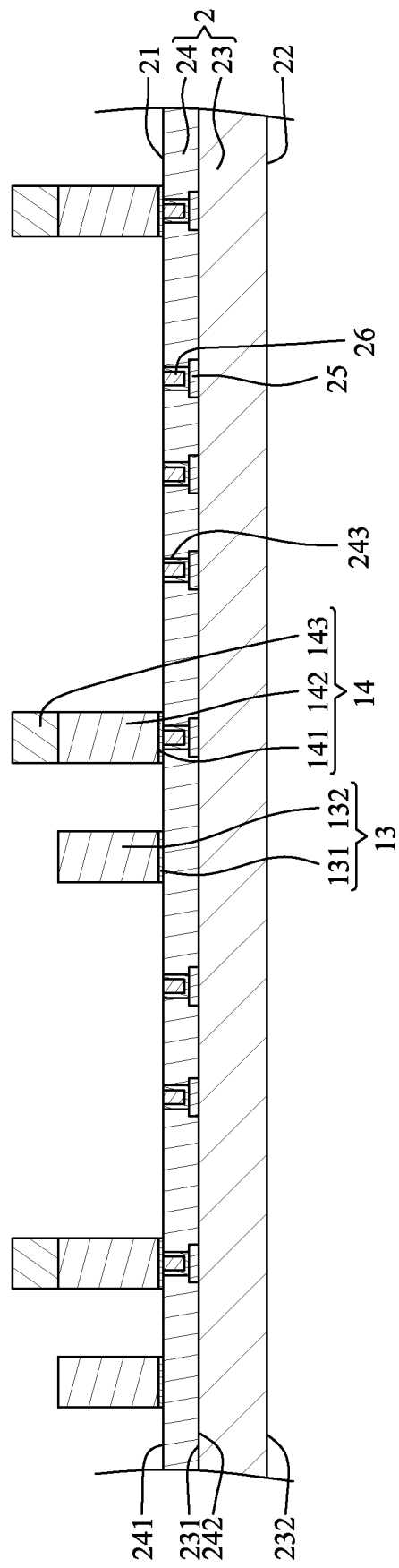
FIG. 14 illustrates one or more stages of an example of a method for manufacturing a package structure according to some embodiments of the present disclosure.

Referring to FIG. 14, the second photoresist layer 74 is removed. Then, a portion of the seed layer 70 that is not covered by the pillar body 132 and the lower pillar body 142 is removed by, for example, etching. Meanwhile, at least one dummy pillar 13 and at least one conductive pillar 14 are formed. In some embodiments, the dummy pillar 13 includes a pillar body 132 and a seed layer 131 interposed between the pillar body 132 and the first surface 21 of the base material 2. Further, the conductive pillar 14 includes an upper pillar body 143, a lower pillar body 142 and a seed layer 141. The lower pillar body 142 is interposed between the upper pillar body 143 and the seed layer 141, and the seed layer 141 is interposed between the lower pillar body 142 and the first surface 21 of the base material 2. In some embodiments, a height of the lower pillar body 142 of the conductive pillar 14 is substantially equal to the height of the pillar body 132 of the dummy pillar 13, and a material of the lower pillar body 142 of the conductive pillar 14 is the same as a material of the pillar body 132 of the dummy pillar 13 since they are formed concurrently at a same stage. A height of the conductive pillar 14 is greater than a height of the dummy pillar 13.

Figure 15:
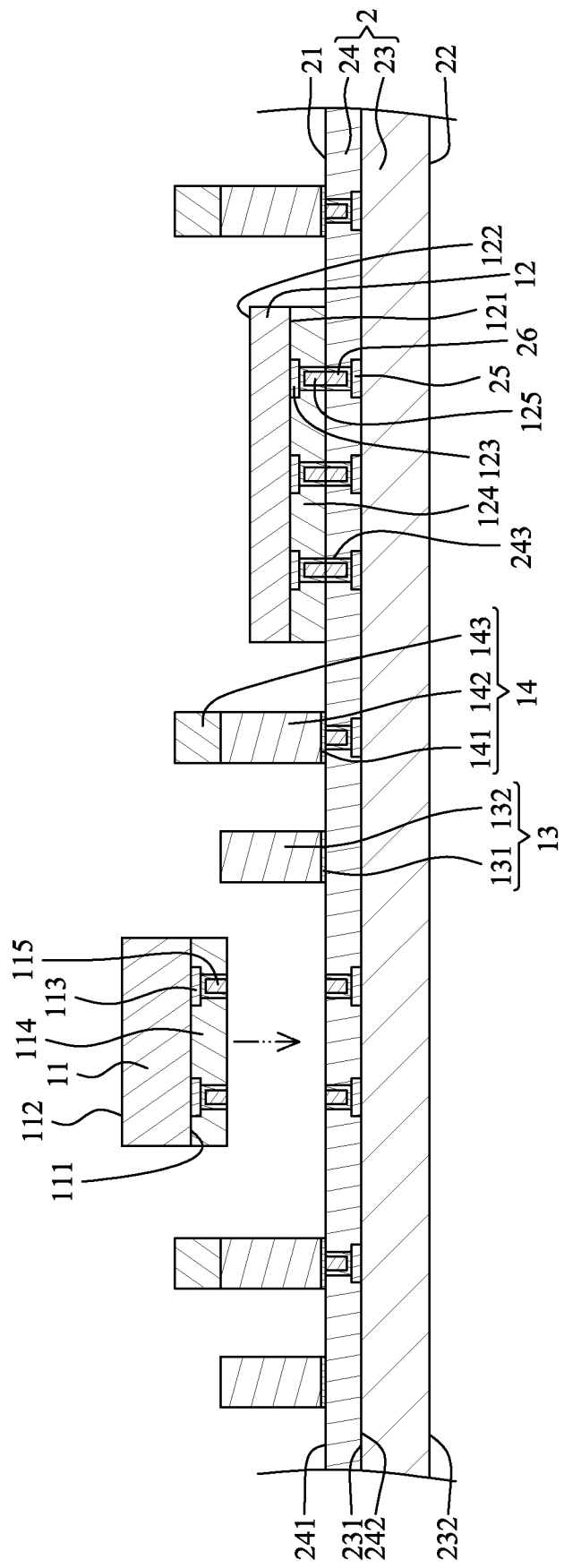
FIG. 15 illustrates one or more stages of an example of a method for manufacturing a package structure according to some embodiments of the present disclosure.

Referring to FIG. 15, at least one electronic device (including, for example, a first electronic device 11 and a second electronic device 12) is electrically connected to the inner vias 26 of the base material 2. Thus, the at least one dummy pillar 13 and the at least one conductive pillar 14 may be disposed between two adjacent electronic devices (e.g., the first electronic device 11 and the second electronic device 12). In some embodiments, the first electronic device 11 has a first surface 111 (e.g., an active surface) and a second surface 112 (e.g., a backside surface) opposite to the first surface 111, and includes a plurality of first pads 113, a first isolation layer 114 and a plurality of first connection vias 115. The second electronic device 12 has a first surface 121 (e.g., an active surface) and a second surface 122 (e.g., a backside surface) opposite to the first surface 121, and includes a plurality of second pads 123, a second isolation layer 124 and a plurality of second connection vias 125.

Figure 16:
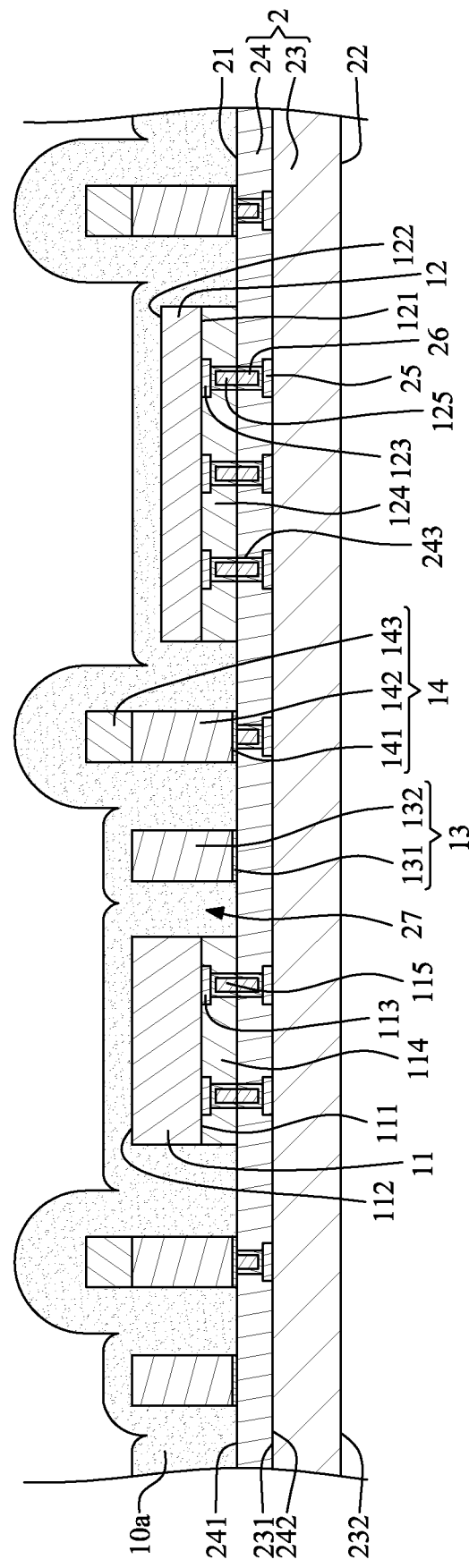
FIG. 16 illustrates one or more stages of an example of a method for manufacturing a package structure according to some embodiments of the present disclosure.

Referring to FIG. 16, a first insulation portion 10a is formed or disposed to cover the second surface 112 and a periphery lateral surface of the first electronic device 11, the second surface 122 and a periphery lateral surface of the second electronic device 12, a periphery lateral surface of the conductive pillar 14, and a top surface and a periphery lateral surface of the dummy pillar 13. A material of the first insulation portion 10a may include a non-polymer material or an inorganic material, such as an oxide material or a nitride material. For example, the material of the first insulation portion 10a may include SiO$_2$ or SiN, and may be formed by physical vapor deposition (PVD). That is, the first insulation portion 10a may not be formed by a molding process, and a top surface of the first insulation portion 10a may be a non-flat surface.

Figure 17:
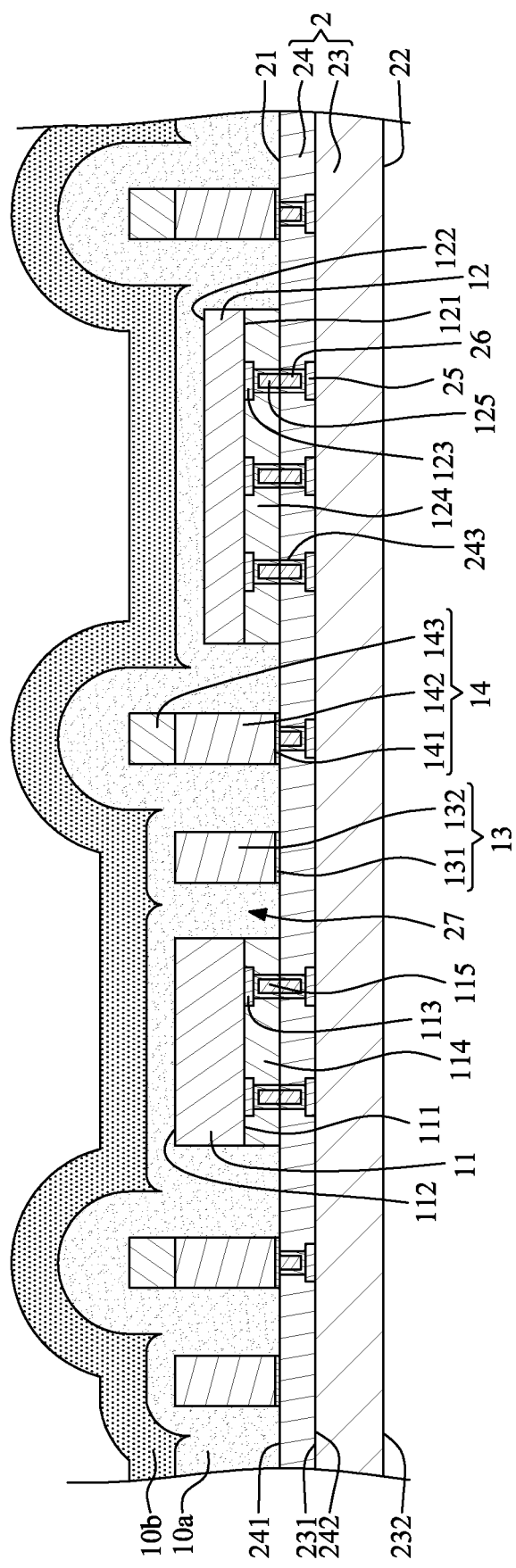
FIG. 17 illustrates one or more stages of an example of a method for manufacturing a package structure according to some embodiments of the present disclosure.

Referring to FIG. 17, a second insulation portion 10b is formed or disposed to cover the first insulation portion 10a. A material of the second insulation portion 10b may include a non-polymer material or an inorganic material, such as an oxide material or a nitride material. For example, the material of the second insulation portion 10b may include SiO$_2$ or SiN, and may be formed by physical vapor deposition (PVD). That is, the second insulation portion 10b may not be formed by a molding process, and a top surface of the second insulation portion 10b may be a non-flat surface.

Figure 18:
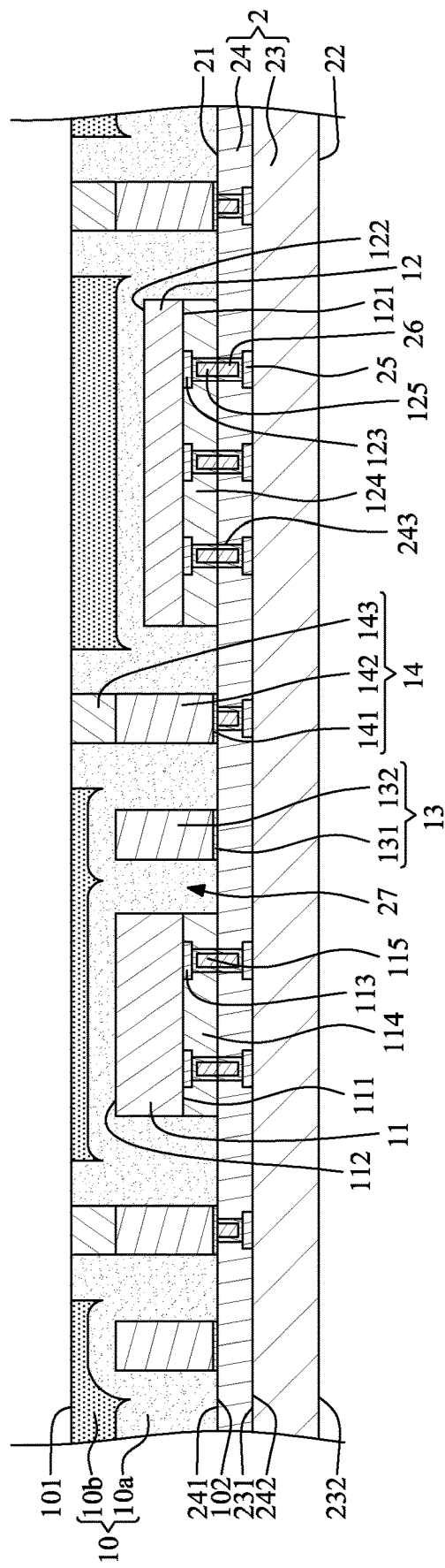
FIG. 18 illustrates one or more stages of an example of a method for manufacturing a package structure according to some embodiments of the present disclosure.

Referring to FIG. 18, a thinning process or flattening process is conducted to remove portions of the first insulation portion 10a and the second insulation portion 10b by, for example, grinding. Meanwhile, an encapsulant 10 is formed. The encapsulant 10 has a first surface 101 and a second surface 102 opposite to the first surface 101, and includes the first insulation portion 10a and the second insulation portion 10b. A top surface of the first insulation portion 10a is substantially coplanar with a top surface of the second insulation portion 10b and a top surface of the conductive pillar 14. That is, the top surfaces of the conductive pillars 14 are exposed from the first surface 101 of the encapsulant 10. In addition, the second insulation portion 10b may be discontinuous. As shown in FIG. 18, the encapsulant 10 covers the second surface 112 and a periphery lateral surface of the first electronic device 11, the second surface 122 and a periphery lateral surface of the second electronic device 12, a periphery lateral surface of the conductive pillar 14, and a top surface and a periphery lateral surface of the dummy pillar 13. That is, the conductive pillars 14 extend through the encapsulant 10, and a top surface of each of the conductive pillars 14 is exposed from the first surface 101 of the encapsulant 10. Further, the dummy pillars 13 do not extend through the encapsulant 10, and are not exposed from the encapsulant 10.

Figure 19:
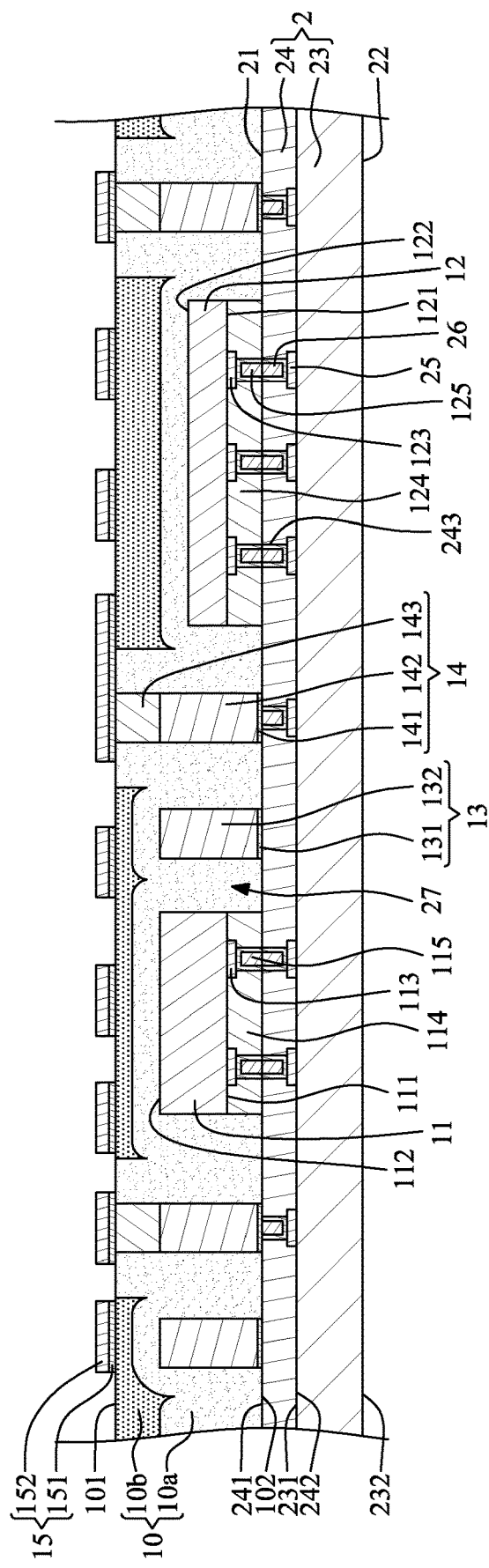
FIG. 19 illustrates one or more stages of an example of a method for manufacturing a package structure according to some embodiments of the present disclosure.

Referring to FIG. 19 to FIG. 23, an upper wiring structure 3 is formed or disposed on the encapsulant 10. The upper wiring structure 3 is electrically connected to the base material 2 through the conductive pillar(s) 14. The formation of the upper wiring structure 3 may be described as follows. Referring to FIG. 19, a first circuit layer 15 is formed or disposed on the first surface 101 of the encapsulant 10, and may include a plurality of traces and a plurality of pads. The pads of the first circuit layer 15 may cover and contact the top surface of the conductive pillar 14. In some embodiments, the first circuit layer 15 may include a seed layer 151 and a metal layer 152. The seed layer 151 is disposed on the first surface 101 of the encapsulant 10, and the metal layer 152 is disposed on the seed layer 151.

Figure 20:
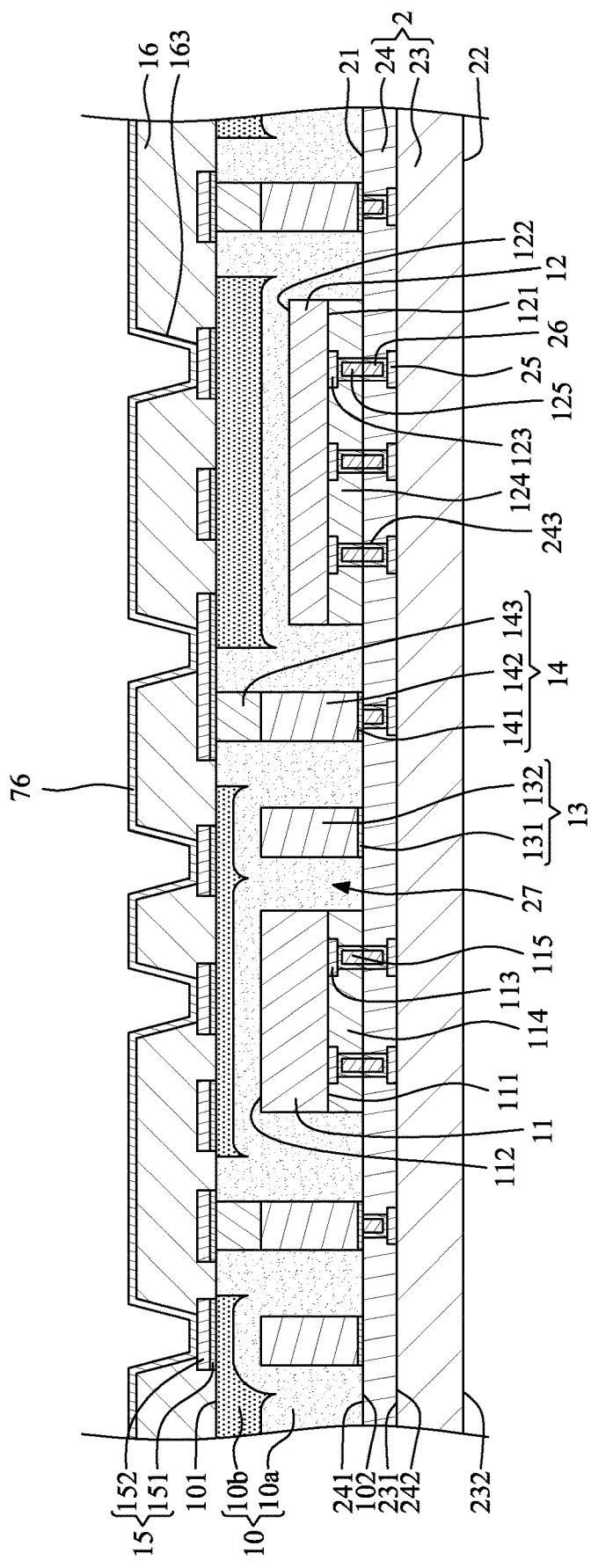
FIG. 20 illustrates one or more stages of an example of a method for manufacturing a package structure according to some embodiments of the present disclosure.

Referring to FIG. 20, a first dielectric layer 16 is formed or disposed on and covers the first circuit layer 15 and the first surface 101 of the encapsulant 10. Then, a plurality of openings 163 are formed in the first dielectric layer 16 to expose portions of the first circuit layer 15. Then, a seed layer 76 is formed on the first dielectric layer 16 and in the openings 163 of the first dielectric layer 16.

Figure 21:
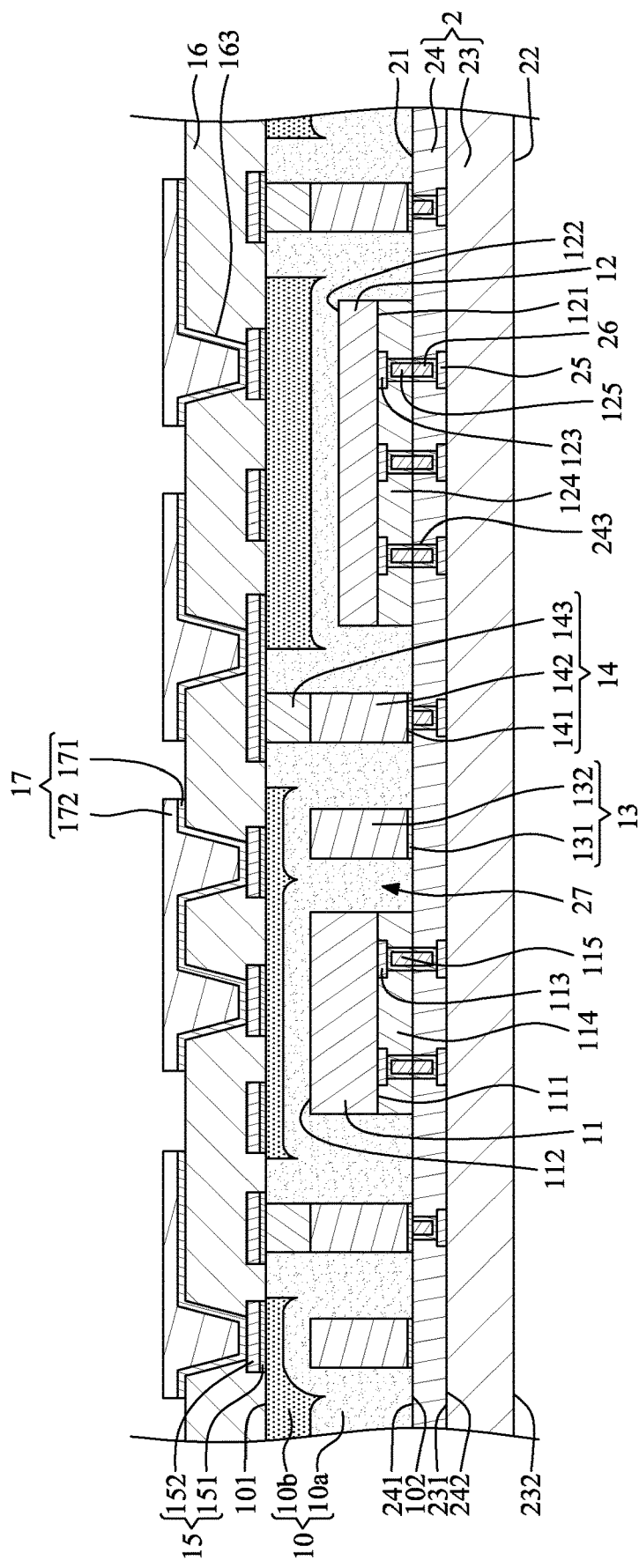
FIG. 21 illustrates one or more stages of an example of a method for manufacturing a package structure according to some embodiments of the present disclosure.

Referring to FIG. 21, a second circuit layer 17 is formed or disposed on the first dielectric layer 16, and may include a plurality of traces and a plurality of pads. In some embodiments, the second circuit layer 17 may include a seed layer 171 and a metal layer 172 disposed on the seed layer 171. The seed layer 171 is formed by etching the seed layer 76. Portions of the second circuit layer 17 may extend into the openings 163 of the first dielectric layer 16 to contact the first circuit layer 15 and forms a plurality of conductive vias.

Figure 22:
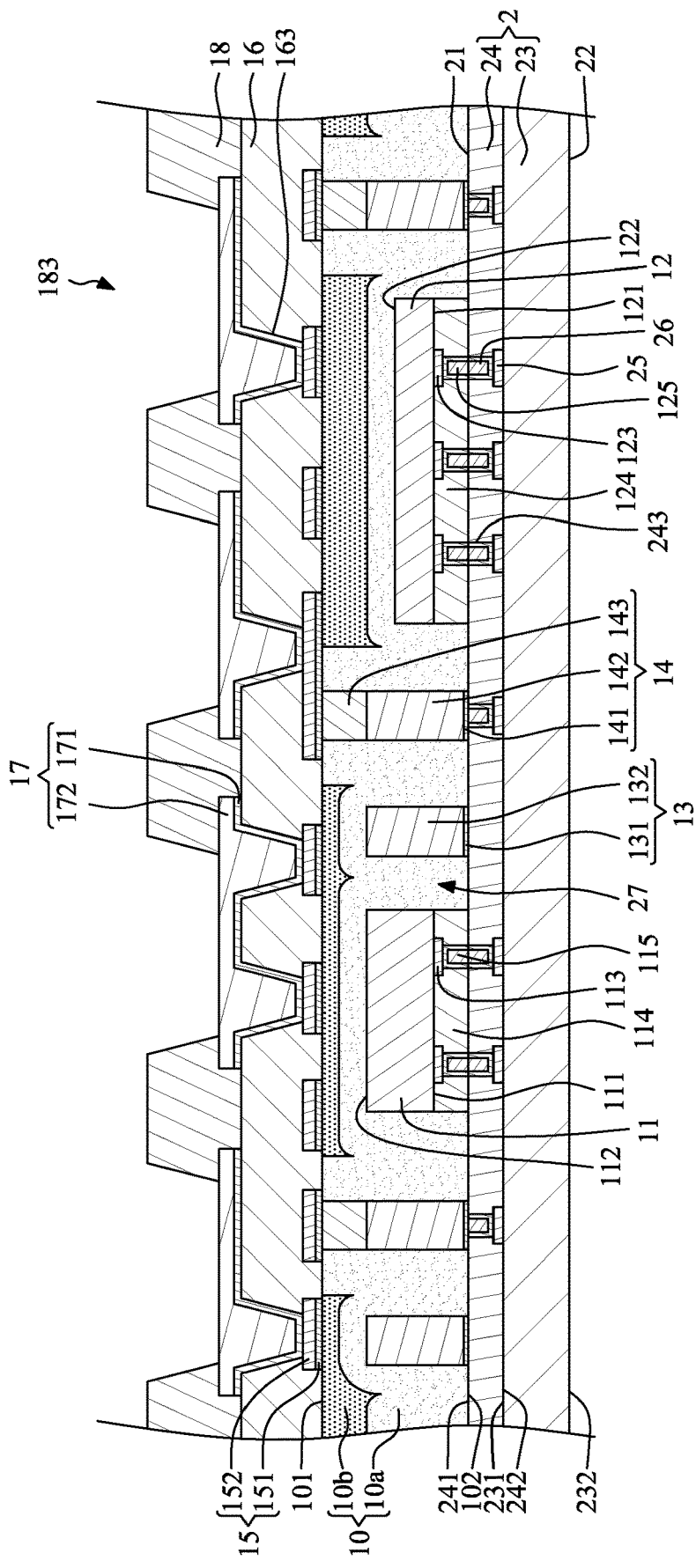
FIG. 22 illustrates one or more stages of an example of a method for manufacturing a package structure according to some embodiments of the present disclosure.

Referring to FIG. 22, a second dielectric layer 18 is formed or disposed on and covers the second circuit layer 17 and the first dielectric layer 16. A material of the second dielectric layer 18 may be the same as or different from a material of the first dielectric layer 16. Then, a plurality of openings 183 are formed in the second dielectric layer 18 to expose portions of the second circuit layer 17.

Figure 23:
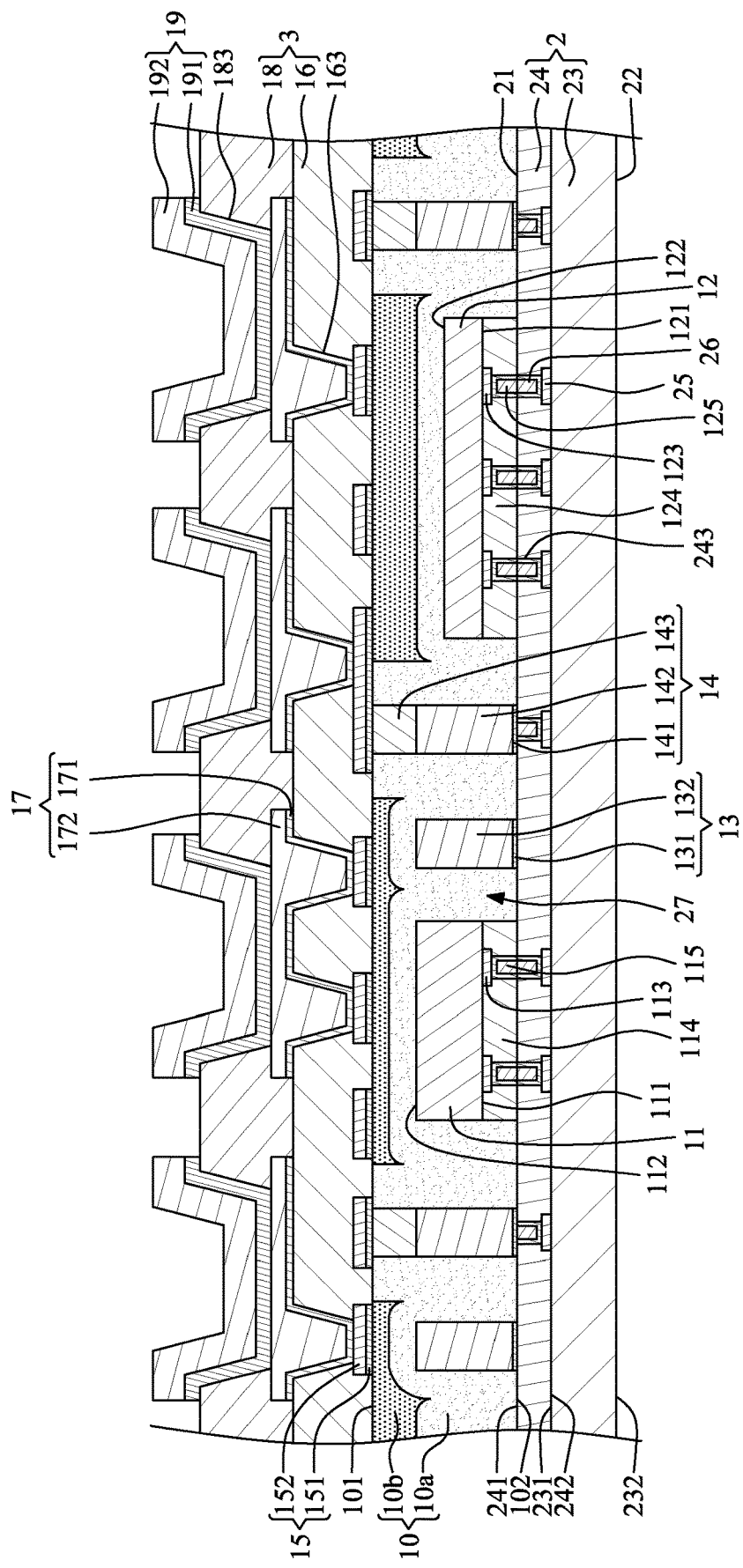
FIG. 23 illustrates one or more stages of an example of a method for manufacturing a package structure according to some embodiments of the present disclosure.

Referring to FIG. 23, a third circuit layer 19 is formed or disposed on the second dielectric layer 18, and may include a plurality of under bump metallurgies (UBMs) disposed in the openings 183 of the second dielectric layer 18 to contact the second circuit layer 17. In some embodiments, the third circuit layer 19 may include a seed layer 191 and a metal layer 192 disposed on the seed layer 191. Meanwhile, an upper wiring structure 3 is formed.

Figure 24:
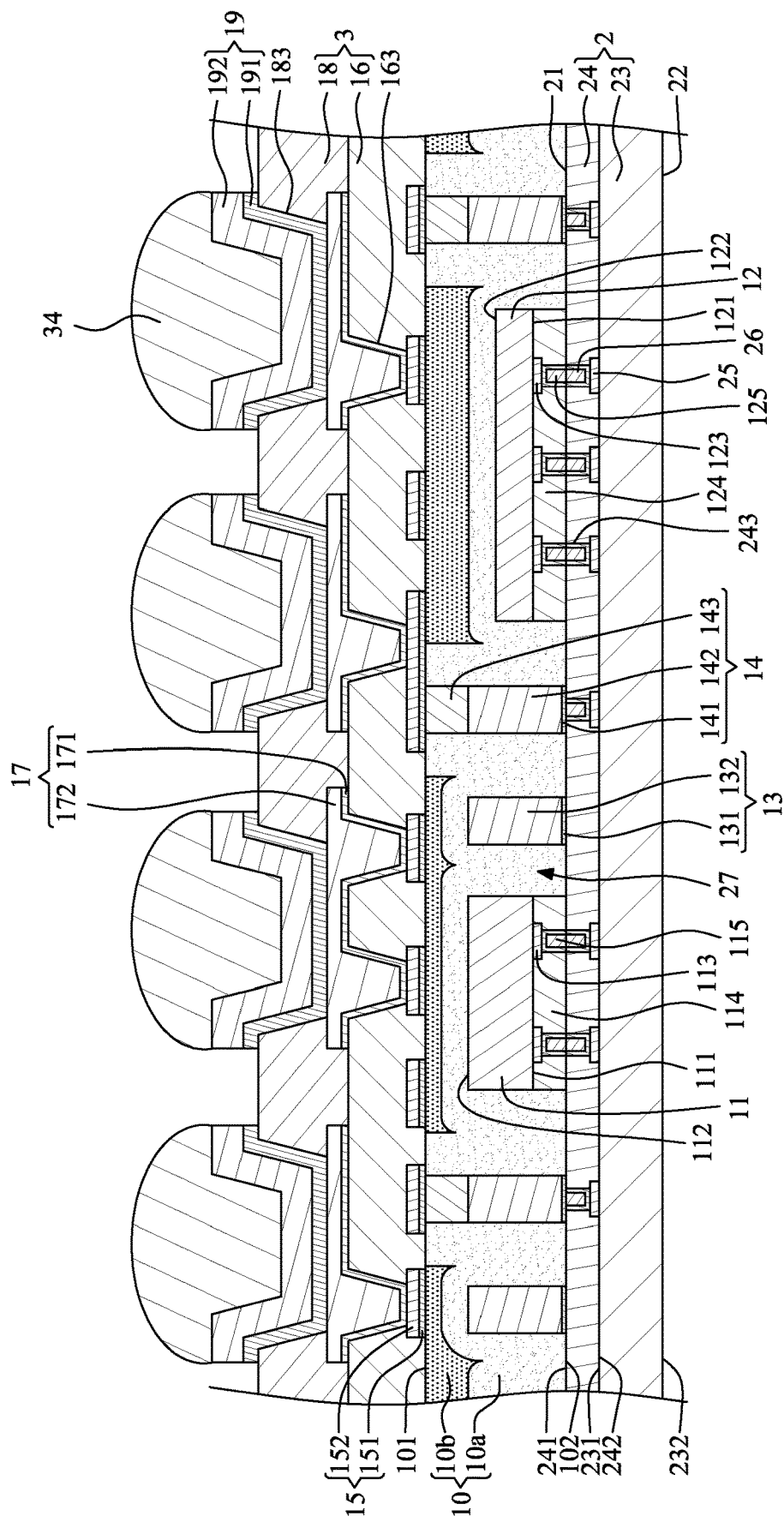
FIG. 24 illustrates one or more stages of an example of a method for manufacturing a package structure according to some embodiments of the present disclosure.

Referring to FIG. 24, at least one external connector 34 is formed or disposed on and electrically connected to the upper wiring structure 3. As shown in FIG. 24, the external connector 34 may be solder balls that are disposed on and electrically connected to respective ones of the under bump metallurgies (UBMs) of the third circuit layer 19 of the upper wiring structure 3. Then, a singulation process is conducted to obtain a plurality of package structures 1 of FIG. 1.

FIG. 25 through FIG. 37 illustrate a method for manufacturing a package structure according to some embodiments of the present disclosure. In some embodiments, the method is for manufacturing the package structure 4 shown in FIG. 8.

Figure 25:
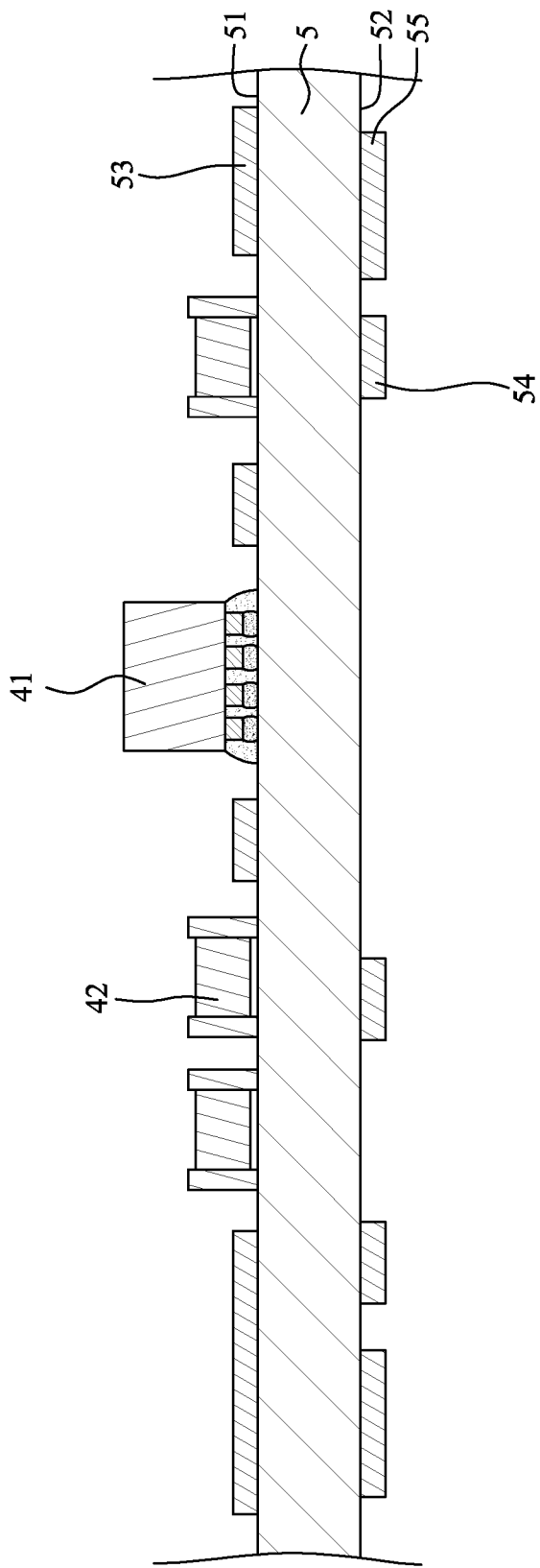
FIG. 25 illustrates one or more stages of an example of a method for manufacturing a package structure according to some embodiments of the present disclosure.

Referring to FIG. 25, a base material 5 is provided. The base material 5 may be a package substrate or a printed circuit board. The base material 5 has an upper surface 51 and a lower surface 52 opposite to the upper surface 51, and includes an upper circuit layer disposed adjacent to or disposed on the upper surface 51 and a lower circuit layer disposed adjacent to or disposed on the lower surface 52. The upper circuit layer may include a plurality of traces, a plurality of conductive pads and a plurality of pillar pads 53. Further, the lower circuit layer may include a plurality of traces, a plurality of conductive pads, a plurality of pillar pads 54 and a plurality of bonding pads 55. Then, at least one upper electronic device (e.g., at least one first upper electronic device 41 and/or at least one second upper electronic device 42) is electrically connected to the upper circuit layer on the upper surface 51 of the base material 5.

Figure 26:
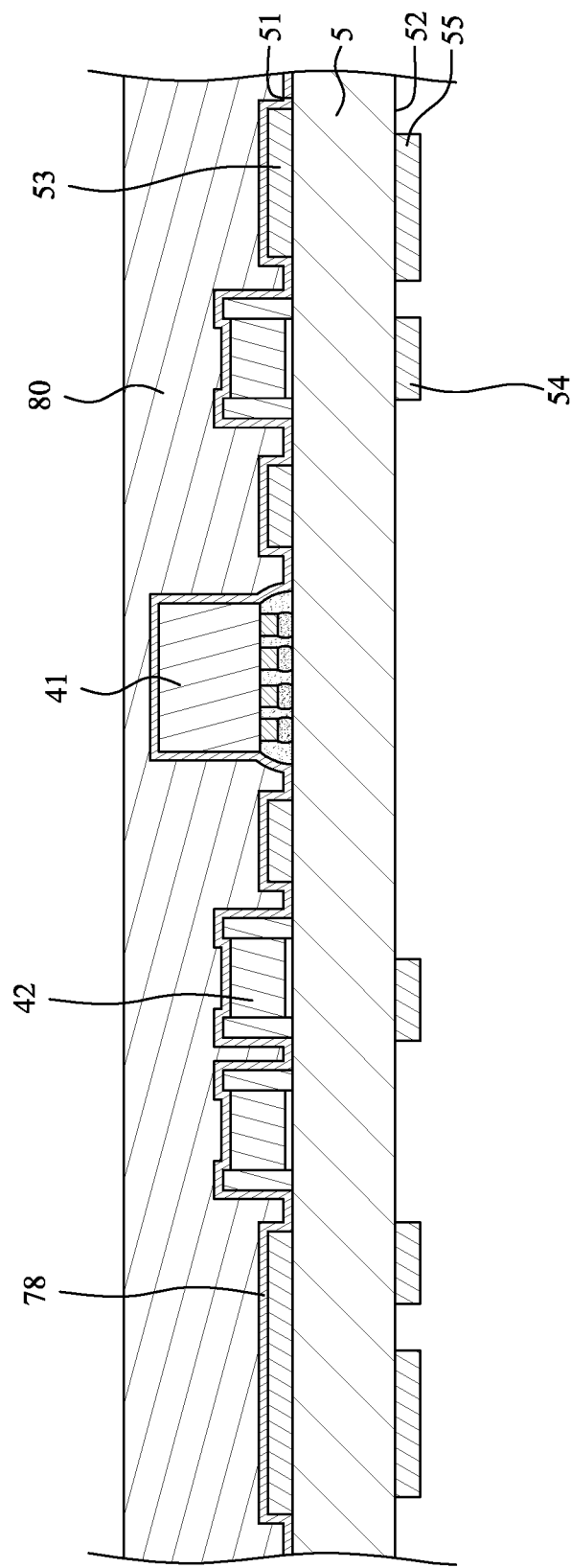
FIG. 26 illustrates one or more stages of an example of a method for manufacturing a package structure according to some embodiments of the present disclosure.

Referring to FIG. 26, a seed layer 78 is formed or disposed on and covers the upper surface 51 of the base material 5, the upper electronic device (e.g., the first upper electronic device 41 and/or the second upper electronic device 42) and the pillar pads 53. Then, a third photoresist layer 80 is formed or disposed on and covers the seed layer 78.

Figure 27:
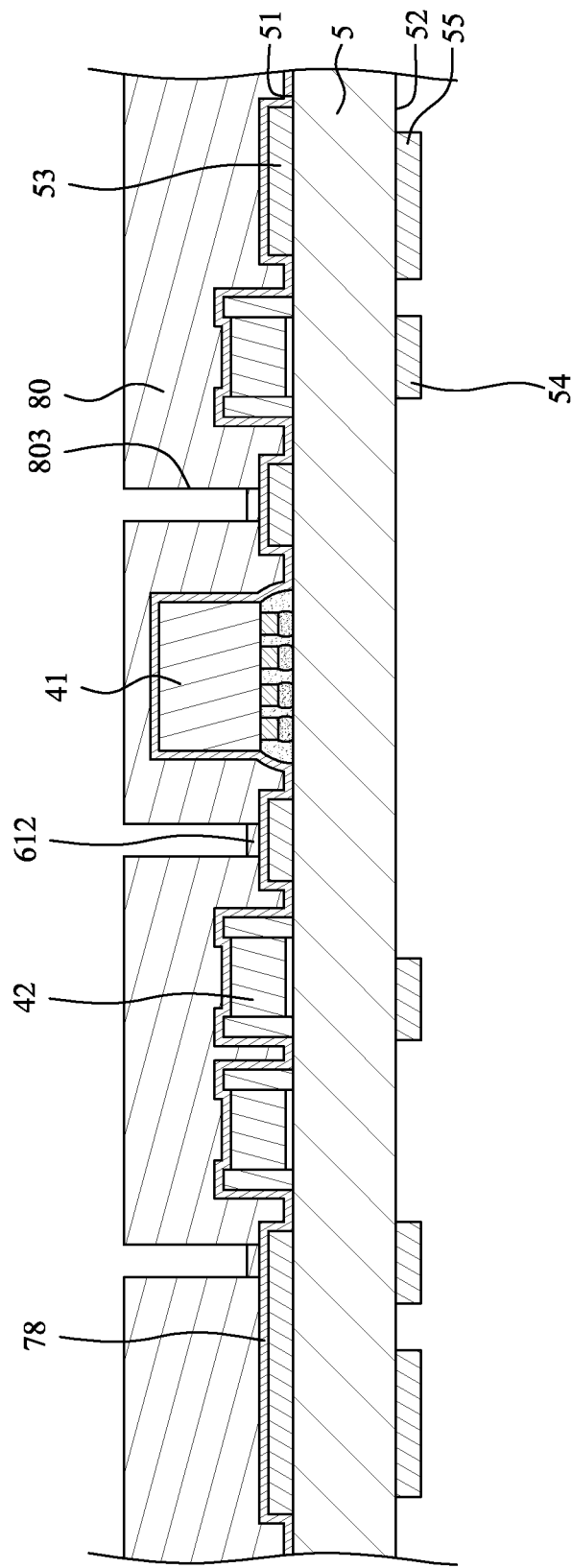
FIG. 27 illustrates one or more stages of an example of a method for manufacturing a package structure according to some embodiments of the present disclosure.

Referring to FIG. 27, a plurality of openings 803 are formed in the third photoresist layer 80 to expose portion(s) of the seed layer 78 corresponding to the pillar pad(s) 53. Then, a first metal material is formed or disposed in the openings 803 of the third photoresist layer 80 by, for example, plating, so as to contact the exposed portion(s) of the seed layer 78 and form at least one pillar body 612.

Figure 28:
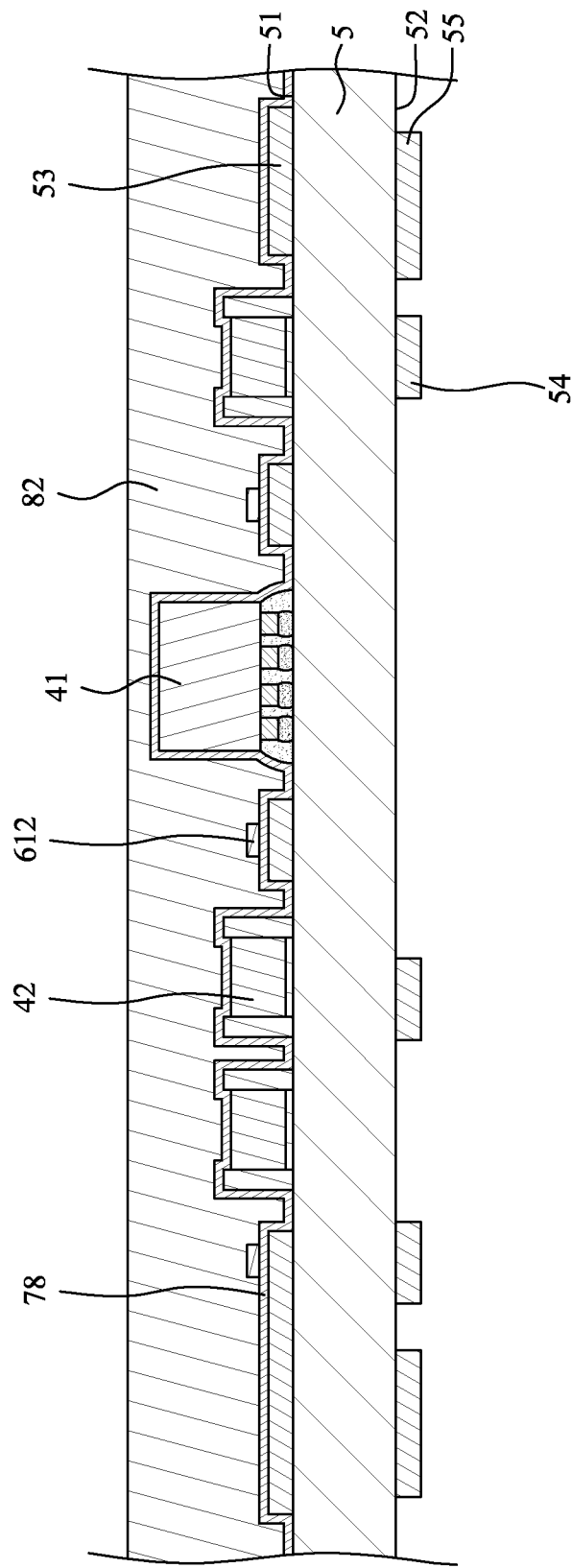
FIG. 28 illustrates one or more stages of an example of a method for manufacturing a package structure according to some embodiments of the present disclosure.

Referring to FIG. 28, the third photoresist layer 80 is removed. Then, a fourth photoresist layer 82 is formed or disposed on the seed layer 78 to cover the pillar body 612.

Figure 29:
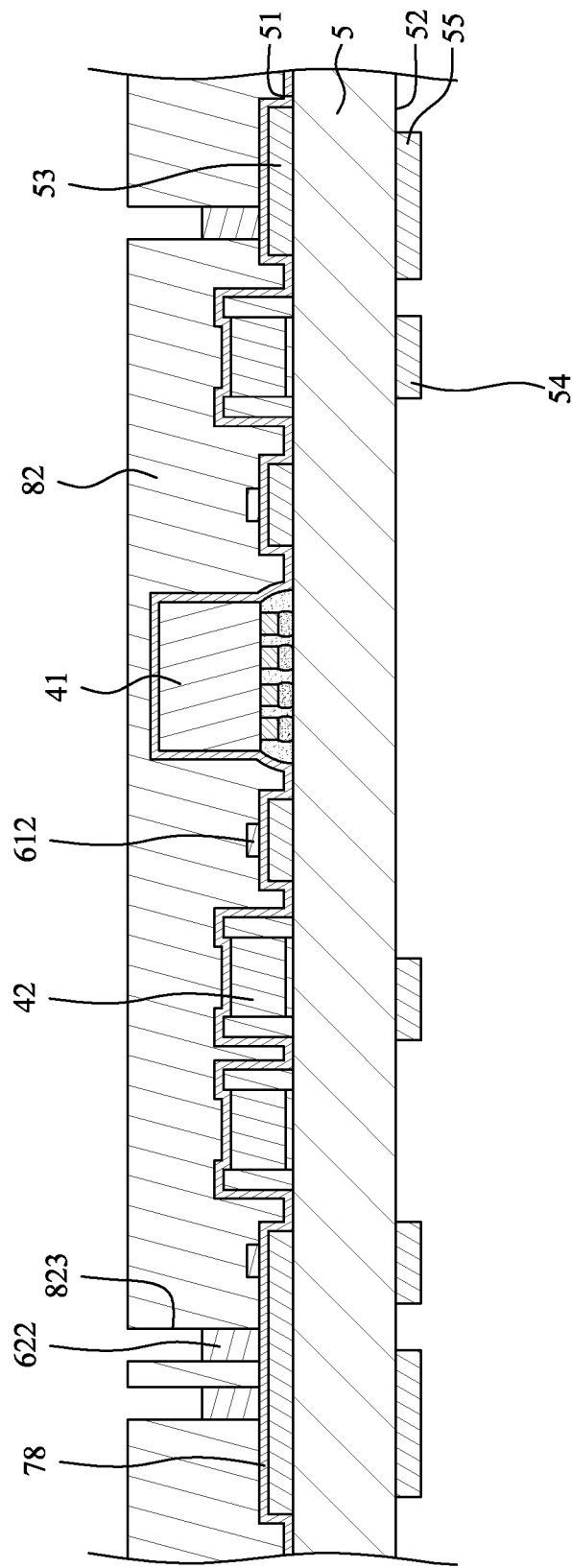
FIG. 29 illustrates one or more stages of an example of a method for manufacturing a package structure according to some embodiments of the present disclosure.

Referring to FIG. 29, a plurality of openings 823 is formed in the fourth photoresist layer 82 to expose portion(s) of the seed layer 78. Then, a second metal material is formed or disposed in the openings 823 of the fourth photoresist layer 82 by, for example, plating, so as to contact the exposed portion(s) of the seed layer 78 and form at least one pillar body 622. A height of the pillar body 622 is greater than a height of the pillar body 612.

Figure 30:
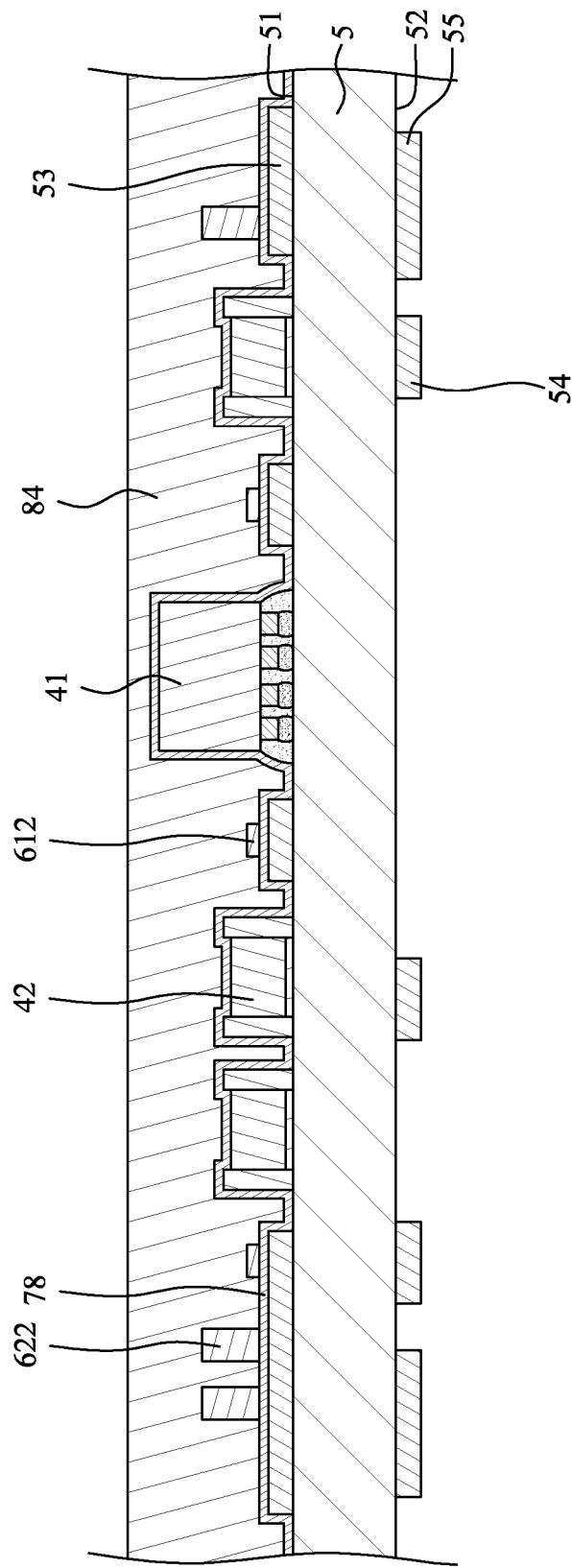
FIG. 30 illustrates one or more stages of an example of a method for manufacturing a package structure according to some embodiments of the present disclosure.

Referring to FIG. 30, the fourth photoresist layer 82 is removed. Then, a fifth photoresist layer 84 is formed or disposed on the seed layer 78 to cover the pillar body 612 and the pillar body 622.

Figure 31:
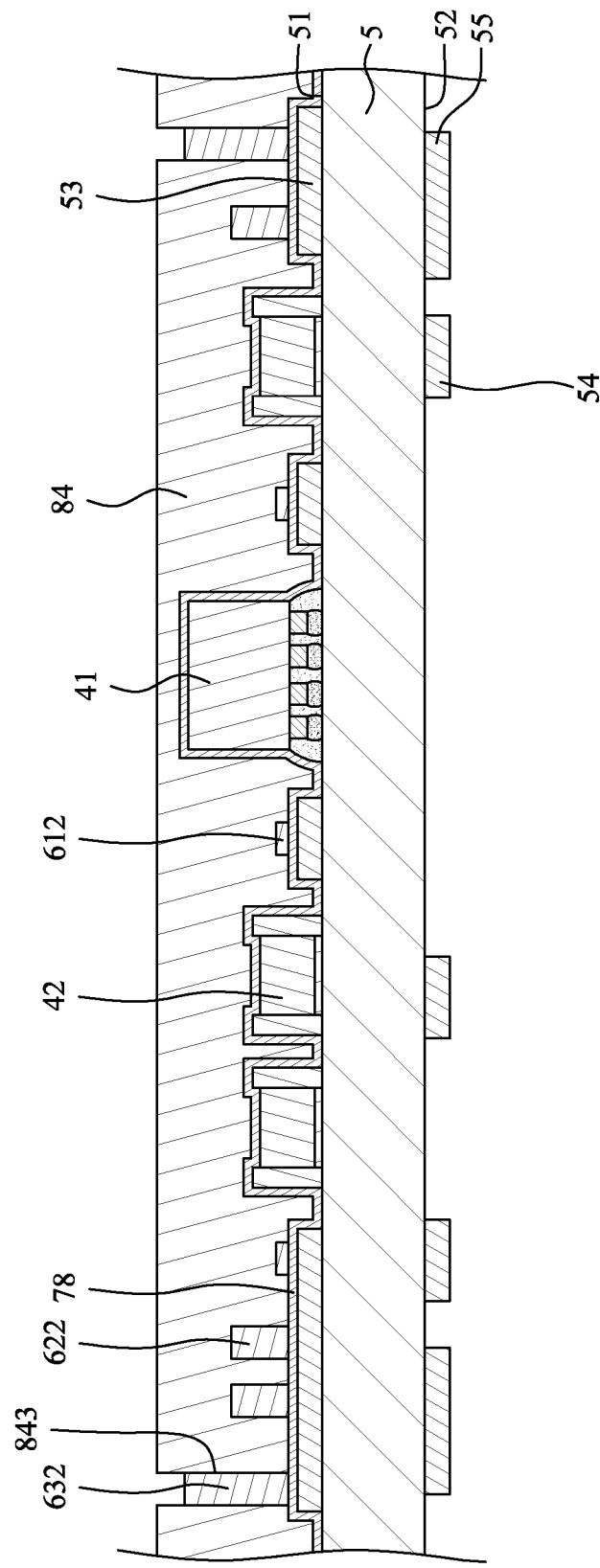
FIG. 31 illustrates one or more stages of an example of a method for manufacturing a package structure according to some embodiments of the present disclosure.

Referring to FIG. 31, a plurality of openings 843 is formed in the fifth photoresist layer 84 to expose portion(s) of the seed layer 78. Then, a third metal material is formed or disposed in the openings 843 of the fifth photoresist layer 84 by, for example, plating, so as to contact the exposed portion(s) of the seed layer 78 and form at least one pillar body 632. A height of the pillar body 632 is greater than a height of the pillar body 622.

Figure 32:
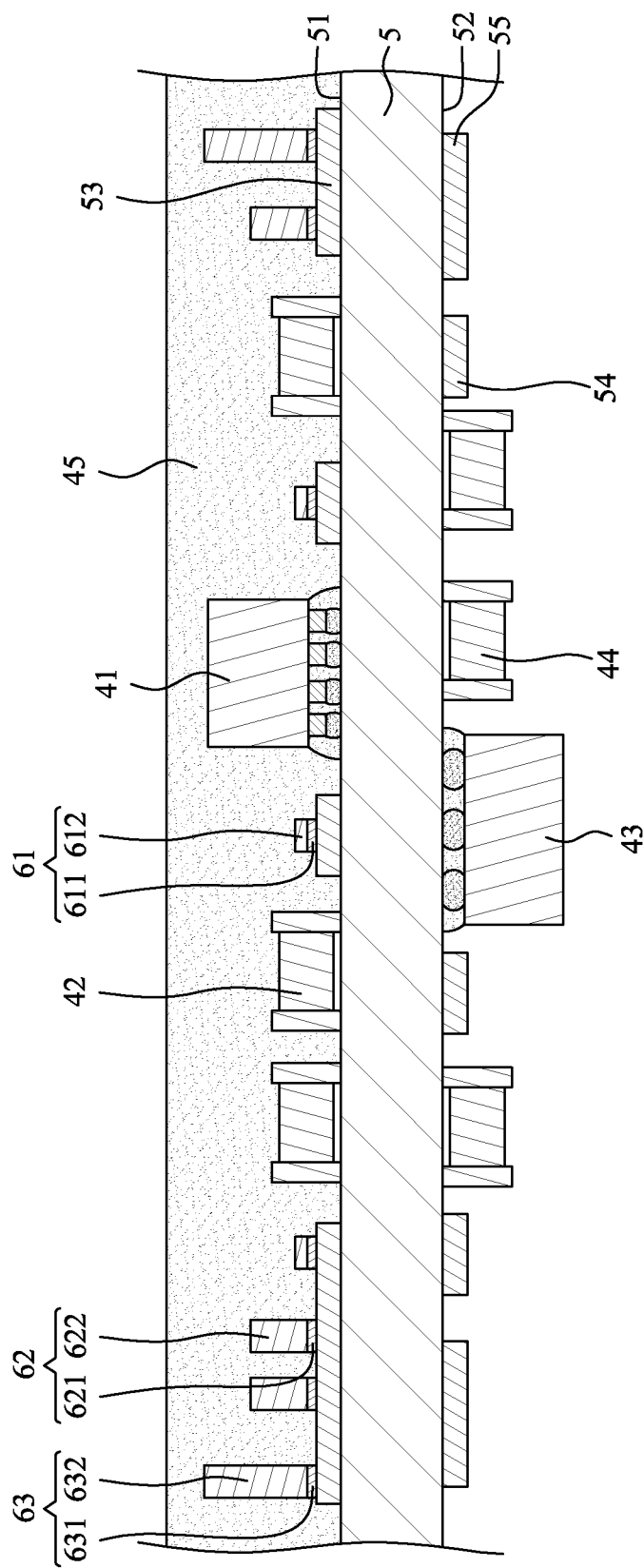
FIG. 32 illustrates one or more stages of an example of a method for manufacturing a package structure according to some embodiments of the present disclosure.

Referring to FIG. 32, the fifth photoresist layer 84 is removed. Then, portions of the seed layer 78 that is not covered by the pillar bodies 612, 622, 632 are removed by, for example, etching. Meanwhile, at least one first upper dummy pillar 61, at least one second upper dummy pillar 62 and at least one third upper dummy pillar 63 are formed or disposed on the pillar pads 53. In some embodiments, the first upper dummy pillar 61 includes the pillar body 612 and a seed layer 611 interposed between the pillar body 612 and the pillar pad 53. Further, the second upper dummy pillar 62 includes the pillar body 622 and a seed layer 621 interposed between the pillar body 622 and the pillar pad 53. The third upper dummy pillar 63 includes the pillar body 632 and a seed layer 631 interposed between the pillar body 632 and the pillar pad 53.

A height of the dummy pillar near the center of the base material 5 is less than a height of the dummy pillar away from the center of the base material 5. For example, the first upper dummy pillar 61 is nearer to or closer to the center of the base material 5 than the second upper dummy pillar 62 is. Thus, a height of the first upper dummy pillar 61 is less than a height of the second upper dummy pillar 62. Further, the second upper dummy pillar 62 is nearer to or closer to the center of the base material 5 than the third upper dummy pillar 63 is. Thus, a height of the second upper dummy pillar 62 is less than a height of the third upper dummy pillar 63. Then, an upper encapsulant 45 is formed to cover the upper electronic devices (e.g., the first upper electronic device 41 and the second upper electronic device 42) and the upper dummy pillars (e.g., the first upper dummy pillar 61, the second upper dummy pillar 62 and the third upper dummy pillar 63).

Then, at least one first lower electronic device 43 and at least one second lower electronic device 44 are electrically connected to the lower circuit layer on the lower surface 52 of the base material 5.

Figure 33:
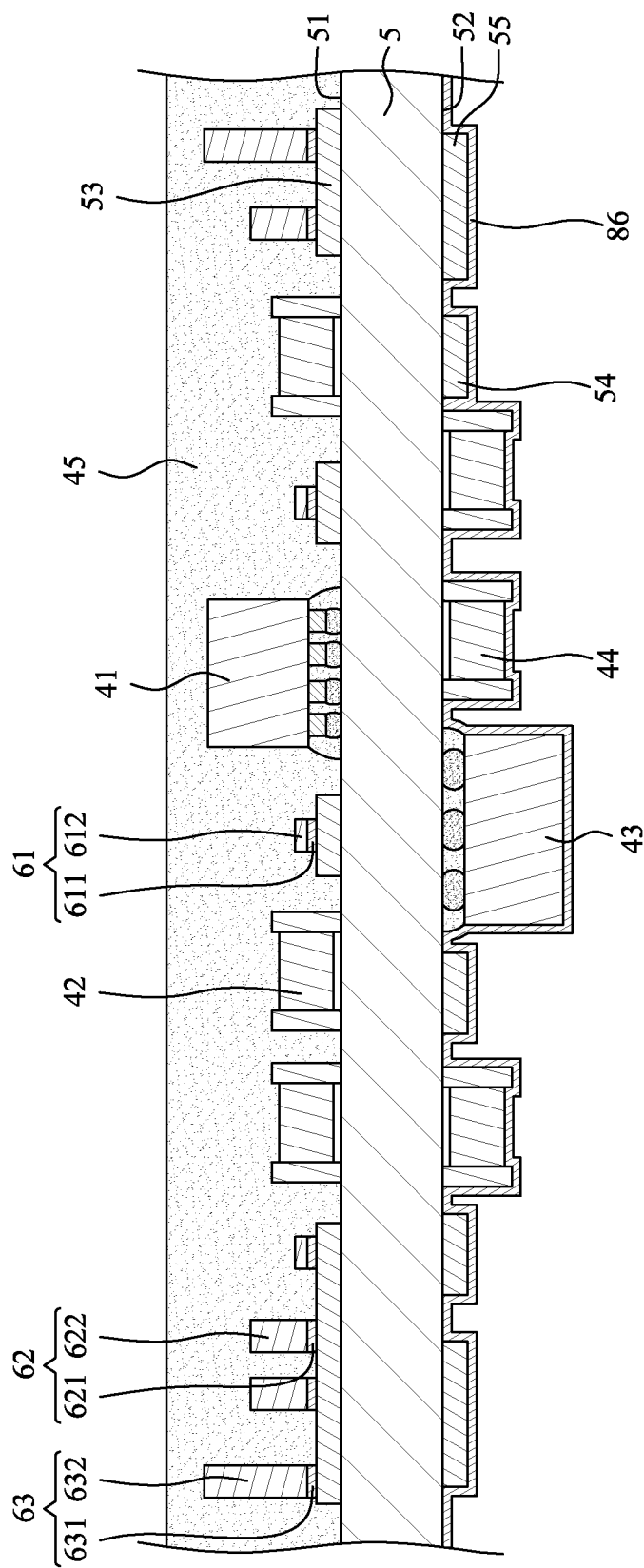
FIG. 33 illustrates one or more stages of an example of a method for manufacturing a package structure according to some embodiments of the present disclosure.

Referring to FIG. 33, a seed layer 86 is formed or disposed on and covers the lower surface 52 of the base material 5, the lower electronic device (e.g., the first lower electronic device 43 and/or the second lower electronic device 44), the pillar pads 54 and the bonding pads 55.

Figure 34:
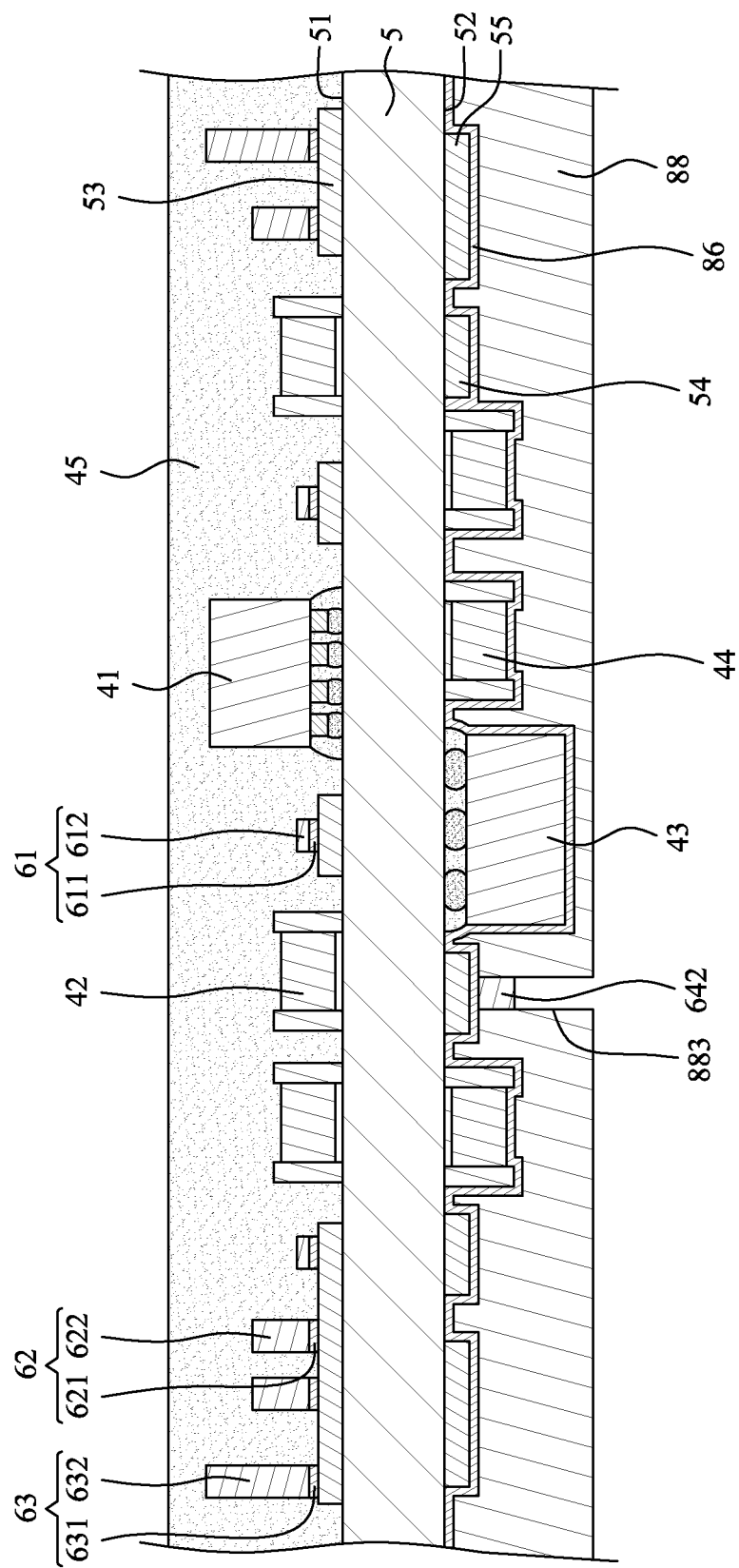
FIG. 34 illustrates one or more stages of an example of a method for manufacturing a package structure according to some embodiments of the present disclosure.

Referring to FIG. 34, a sixth photoresist layer 88 is formed or disposed on and covers the seed layer 86. Then, a plurality of openings 883 are formed in the sixth photoresist layer 88 to expose portion(s) of the seed layer 86 corresponding to the pillar pad(s) 54. Then, a fourth metal material is formed or disposed in the openings 883 of the sixth photoresist layer 88 by, for example, plating, so as to contact the exposed portion(s) of the seed layer 86 and form at least one pillar body 642.

Figure 35:
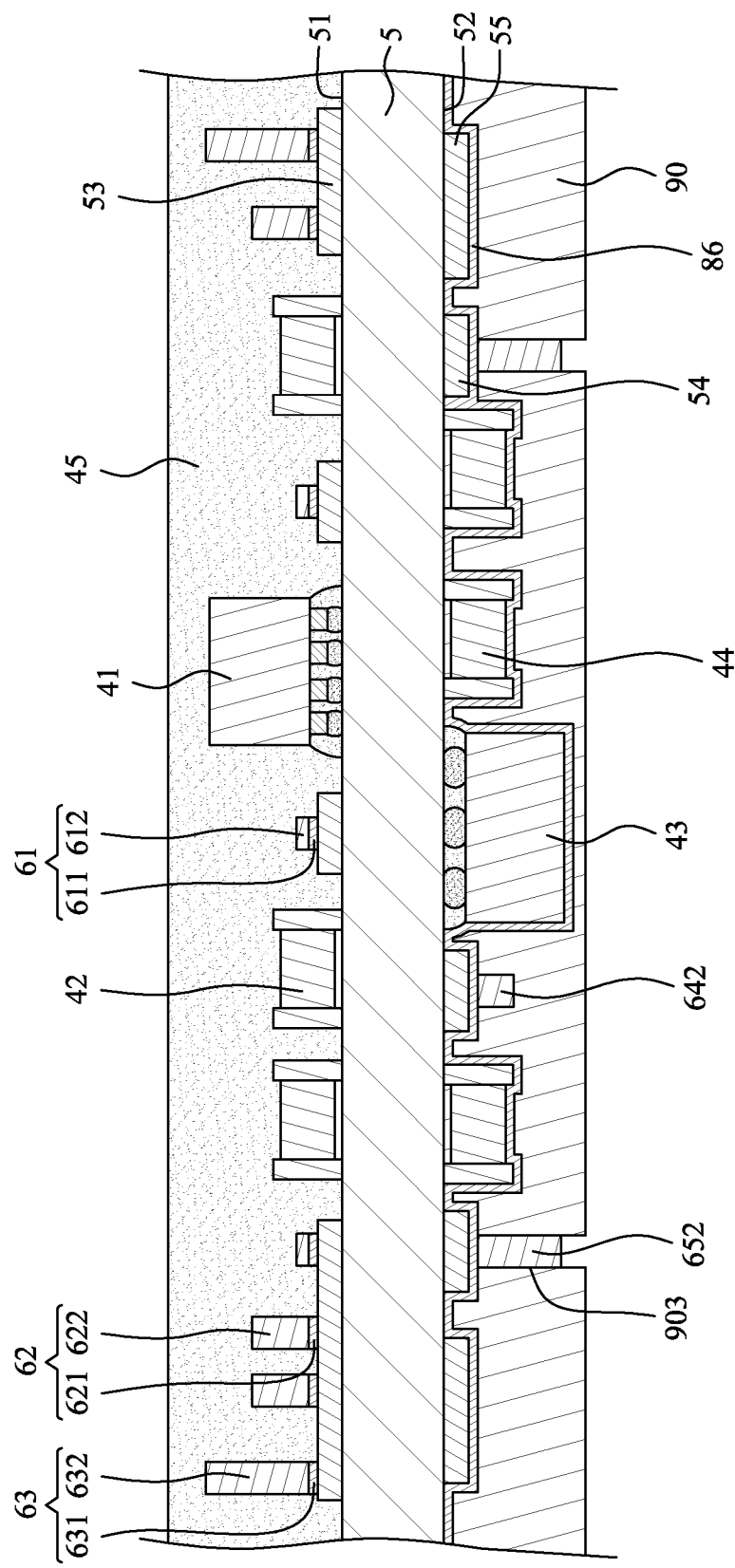
FIG. 35 illustrates one or more stages of an example of a method for manufacturing a package structure according to some embodiments of the present disclosure.

Referring to FIG. 35, the sixth photoresist layer 88 is removed. Then, a seventh photoresist layer 90 is formed or disposed on the seed layer 86 to cover the pillar body 642. Then, a plurality of openings 903 is formed in the seventh photoresist layer 90 to expose portion(s) of the seed layer 86. Then, a fifth metal material is formed or disposed in the openings 903 of the seventh photoresist layer 90 by, for example, plating, so as to contact the exposed portion(s) of the seed layer 86 and form at least one pillar body 652. A height of the pillar body 652 is greater than a height of the pillar body 642.

Figure 36:
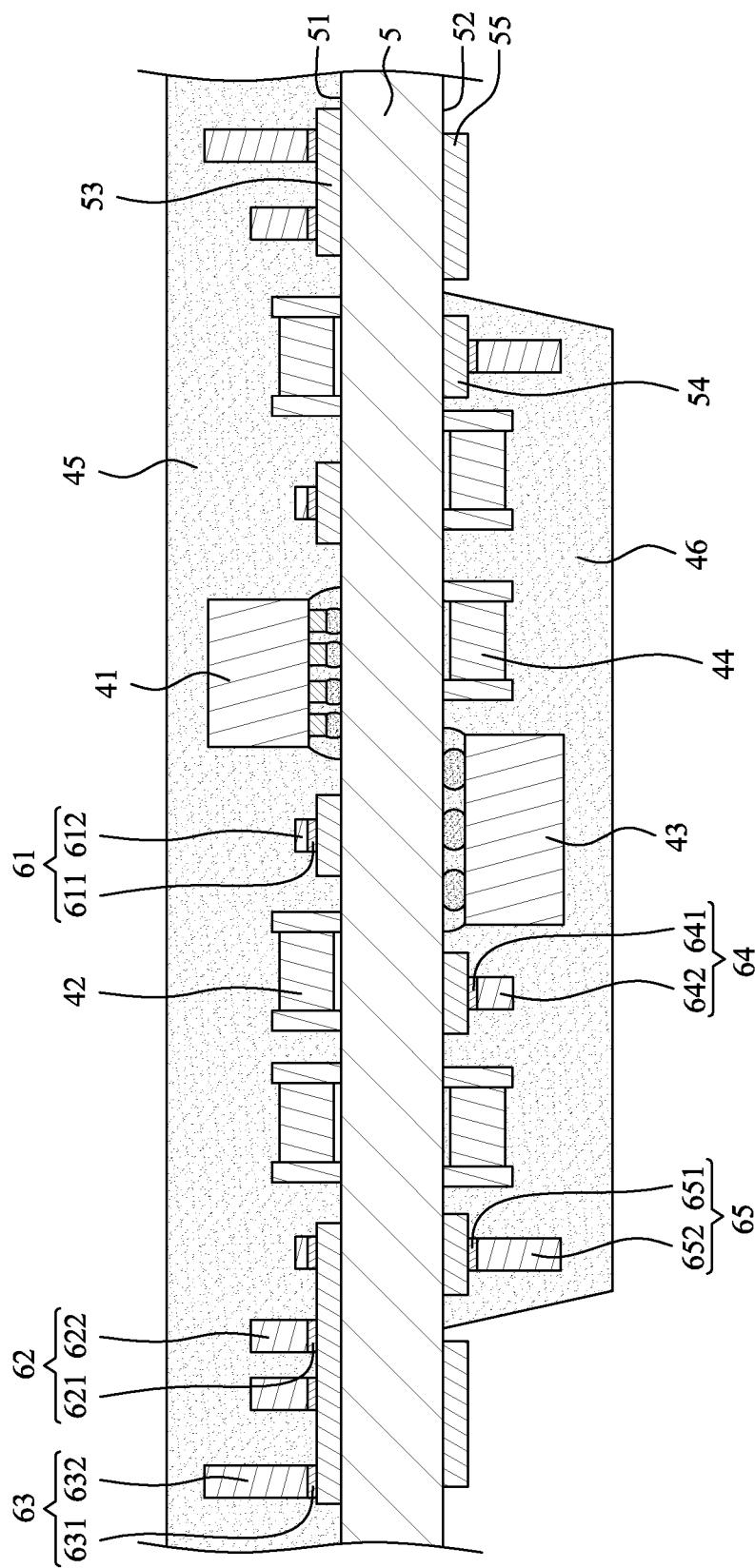
FIG. 36 illustrates one or more stages of an example of a method for manufacturing a package structure according to some embodiments of the present disclosure.

Referring to FIG. 36, the seventh photoresist layer 90 is removed. Then, portions of the seed layer 86 that is not covered by the pillar bodies 642, 652 are removed by, for example, etching. Meanwhile, at least one first lower dummy pillar 64 and at least one second lower dummy pillar 65 are formed or disposed on the pillar pads 54. In some embodiments, the first lower dummy pillar 64 includes the pillar body 642 and a seed layer 641 interposed between the pillar body 642 and the pillar pad 54. Further, the second lower dummy pillar 65 includes the pillar body 652 and a seed layer 651 interposed between the pillar body 652 and the pillar pad 54. The first lower dummy pillar 64 is nearer to or closer to the center of the base material 5 than the second lower dummy pillar 65 is. Thus, a height of the first lower dummy pillar 64 is less than a height of the second lower dummy pillar 65.

Then, a lower encapsulant 46 is formed to cover the lower electronic devices (e.g., the first lower electronic device 43 and the second lower electronic device 44) and the lower dummy pillars (e.g., the first lower dummy pillar 64 and the second lower dummy pillar 65).

Figure 37:
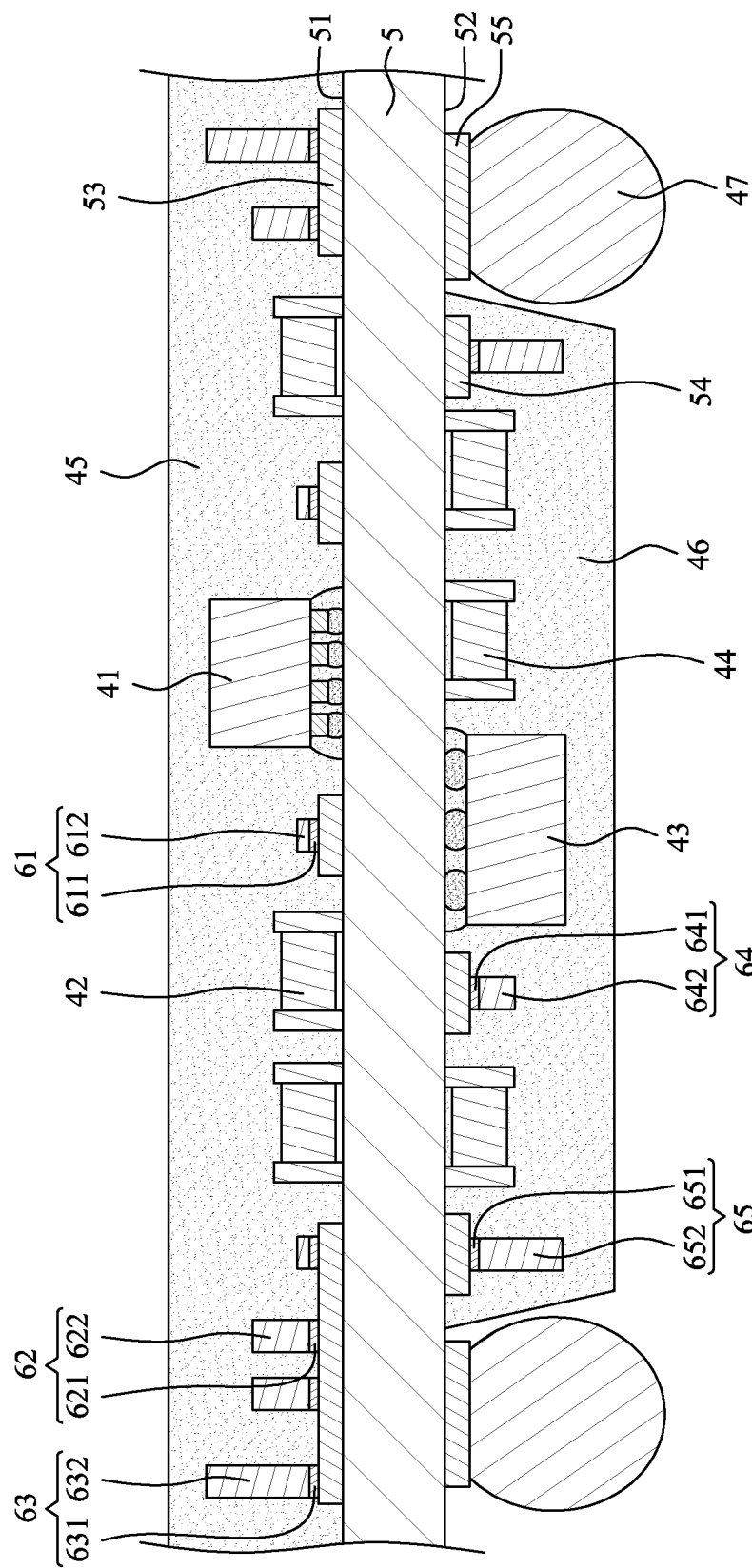
FIG. 37 illustrates one or more stages of an example of a method for manufacturing a package structure according to some embodiments of the present disclosure.

Referring to FIG. 37, a plurality of external connectors 47 (such as solder balls) are disposed on and electrically connected to the bonding pads 55 on the lower surface 52 of the base material 5. Then, a singulation process is conducted to obtain a plurality of package structures 4 of FIG. 8.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a base material;
   a first electronic device and a second electronic device electrically connected to the base material, wherein a thickness of the first electronic device is greater than a thickness of the second electronic device;
   a plurality of dummy pillars disposed on the base material, wherein a height of a dummy pillar near the first electronic device is greater than a height of a dummy pillar near the second electronic device; and
   an encapsulant covering the first electronic device, the second electronic device and top ends of the dummy pillars.

2. The package structure of claim 1, wherein the base material includes:
   a main body including a plurality of pads;
   a passivation layer disposed on the main body, and defining a plurality of openings to expose the pads; and
   a plurality of inner vias disposed in the openings of the passivation layer, and connecting the pads, wherein the first electronic device and the second electronic device are electrically connected to the inner vias of the base material.

3. The package structure of claim 1, wherein each of the first electronic device and the second electronic device includes at least one semiconductor chip and/or at least one passive component.

4. The package structure of claim 1, wherein the dummy pillars are disposed between the first electronic device and the second electronic device.

5. The package structure of claim 4, wherein a distance between a top surface of the first electronic device and a top surface of the base material is defined as a first distance, a distance between a top surface of the second electronic device and the top surface of the base material is defined as a second distance, a gap between the first electronic device and the second electronic device is greater than 0.45 times a sum of the first distance and the second distance.

6. The package structure of claim 1, wherein each of the dummy pillars includes a pillar body and a seed layer interposed between the pillar body and the base material, and a periphery lateral surface of the pillar body is substantially coplanar with a periphery lateral surface of the seed layer.

7. The package structure of claim 1, wherein the encapsulant includes a first insulation portion and a second insulation portion, the first insulation portion covers the first electronic device, the second electronic device and the top ends of the dummy pillars, the second insulation portion is embedded in the first insulation portion, and a top surface of the first insulation portion is substantially coplanar with a top surface of the second insulation portion.

8. The package structure of claim 7, wherein the second insulation portion is discontinuous.

9. The package structure of claim 1, wherein a material of the encapsulant includes an oxide material or a nitride material.

10. The package structure of claim 1, further comprising at least one conductive pillar extending through the encapsulant.

11. The package structure of claim 10, wherein the conductive pillar includes a lower pillar body, an upper pillar body and a seed layer, the lower pillar body is interposed between the upper pillar body and the seed layer, the seed layer is interposed between the lower pillar body and the base material.

12. The package structure of claim 10, further comprising an upper wiring structure disposed on the encapsulant and electrically connected to the base material through the at least one conductive pillar.

13. The package structure of claim 12, wherein the upper wiring structure includes at least one dielectric layer and at least one circuit layer.

14. The package structure of claim 12, further comprising at least one external connector disposed on and electrically connected to the upper wiring structure.

15. The package structure of claim 11, wherein the material of the lower pillar body is different from the material of the upper pillar body.

16. The package structure of claim 10, wherein a height of the conductive pillar is greater than a height of each of the dummy pillars.

17. The package structure of claim 4, further comprising at least one conductive pillar disposed between the first electronic device and the second electronic device and extending through the encapsulant.

18. The package structure of claim 10, wherein a top surface of each of the dummy pillars is covered by the encapsulant and a top surface of the conductive pillar is exposed from a top surface of the encapsulant.

19. The package structure of claim 10, wherein the encapsulant includes a first insulation portion and a second insulation portion, the first insulation portion covers the first electronic device, the second electronic device and the top ends of the dummy pillars, the second insulation portion is embedded in the first insulation portion, a top surface of the first insulation portion is substantially coplanar with a top surface of the second insulation portion, and the top surface of the first insulation portion is substantially coplanar with a top surface of the conductive pillar.

* * * * *